United States Patent
Tange et al.

(10) Patent No.: US 10,411,058 B2
(45) Date of Patent: Sep. 10, 2019

(54) SEMICONDUCTOR APPARATUS, SYSTEM, AND METHOD OF PRODUCING SEMICONDUCTOR APPARATUS

(71) Applicant: CANON KABUSHIKI KAISHA, Tokyo (JP)

(72) Inventors: Tsutomu Tange, Yokohama (JP); Yukinobu Suzuki, Koza-gun (JP); Aiko Kato, Machida (JP); Koji Hara, Ichikawa (JP); Takehito Okabe, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/849,229

(22) Filed: Dec. 20, 2017

(65) Prior Publication Data

US 2018/0182802 A1 Jun. 28, 2018

(30) Foreign Application Priority Data

Dec. 27, 2016 (JP) ................. 2016-254369

(51) Int. Cl.
*H01L 27/146* (2006.01)
*H01L 21/768* (2006.01)
(Continued)

(52) U.S. Cl.
CPC .. *H01L 27/14636* (2013.01); *H01L 21/76846* (2013.01); *H01L 21/76877* (2013.01);
(Continued)

(58) Field of Classification Search
CPC .......... H01L 21/76802–76817; H01L 21/76877–76883; H01L 23/481; H01L 27/14636
See application file for complete search history.

(56) References Cited

U.S. PATENT DOCUMENTS

2001/0030332 A1  10/2001  Asada
2003/0057562 A1  3/2003  Tsukamoto
(Continued)

FOREIGN PATENT DOCUMENTS

JP  2001-284359 A  10/2001
JP  2003-142683 A  5/2003
(Continued)

*Primary Examiner* — Daniel P Shook
(74) *Attorney, Agent, or Firm* — Canon U.S.A. Inc., IP Division

(57) ABSTRACT

A semiconductor apparatus includes a silicon layer including first and second semiconductor regions; an insulator film, on the silicon layer, having first and second holes positioned on the first and second semiconductor regions; a first metal portion containing a first metal element in the first hole; a first conductor portion containing a second metal element between the first metal portion and the first semiconductor region; a first silicide region containing the second metal element between the first conductor portion and the first semiconductor region; a second metal portion containing the first metal element in the second hole; a second conductor portion containing the second metal element between the second metal portion and the second semiconductor region; and a second silicide region containing a third metal element between the second conductor portion and the second semiconductor region, wherein the first conductor portion thickness is greater than the second conductor portion thickness.

17 Claims, 25 Drawing Sheets

(51) Int. Cl.
*H01L 29/78* (2006.01)
*H01L 29/08* (2006.01)

(52) U.S. Cl.
CPC .. *H01L 27/14612* (2013.01); *H01L 27/14685* (2013.01); *H01L 29/78* (2013.01); *H01L 29/0847* (2013.01)

(56) References Cited

U.S. PATENT DOCUMENTS

| | | |
|---|---|---|
| 2003/0197228 A1 | 10/2003 | Okuda |
| 2004/0141077 A1 | 7/2004 | Ohkawa |
| 2005/0067640 A1 | 3/2005 | Ohkawa |
| 2008/0070341 A1 | 3/2008 | Yuzurihara |
| 2011/0073971 A1 | 3/2011 | Takeda |
| 2013/0089947 A1* | 4/2013 | Kato ................ H01L 27/14609 438/98 |
| 2013/0183786 A1 | 7/2013 | Itahashi |
| 2013/0341693 A1 | 12/2013 | Yamaguchi |
| 2014/0370645 A1 | 12/2014 | Yamaguchi |
| 2015/0076566 A1 | 3/2015 | Kamino |
| 2015/0123178 A1 | 5/2015 | Nishida |
| 2016/0156817 A1 | 6/2016 | Tezuka |

FOREIGN PATENT DOCUMENTS

| | | |
|---|---|---|
| JP | 2003-249550 A | 9/2003 |
| JP | 2006-318991 A | 11/2006 |
| JP | 2010-010402 A | 1/2010 |
| JP | 2010-251800 A | 11/2010 |
| JP | 2010-283859 A | 12/2010 |
| JP | 2011-204916 A | 10/2011 |
| JP | 2013-051317 A | 3/2013 |
| JP | 2014-090051 A | 5/2014 |
| JP | 2016-103614 A | 6/2016 |

\* cited by examiner

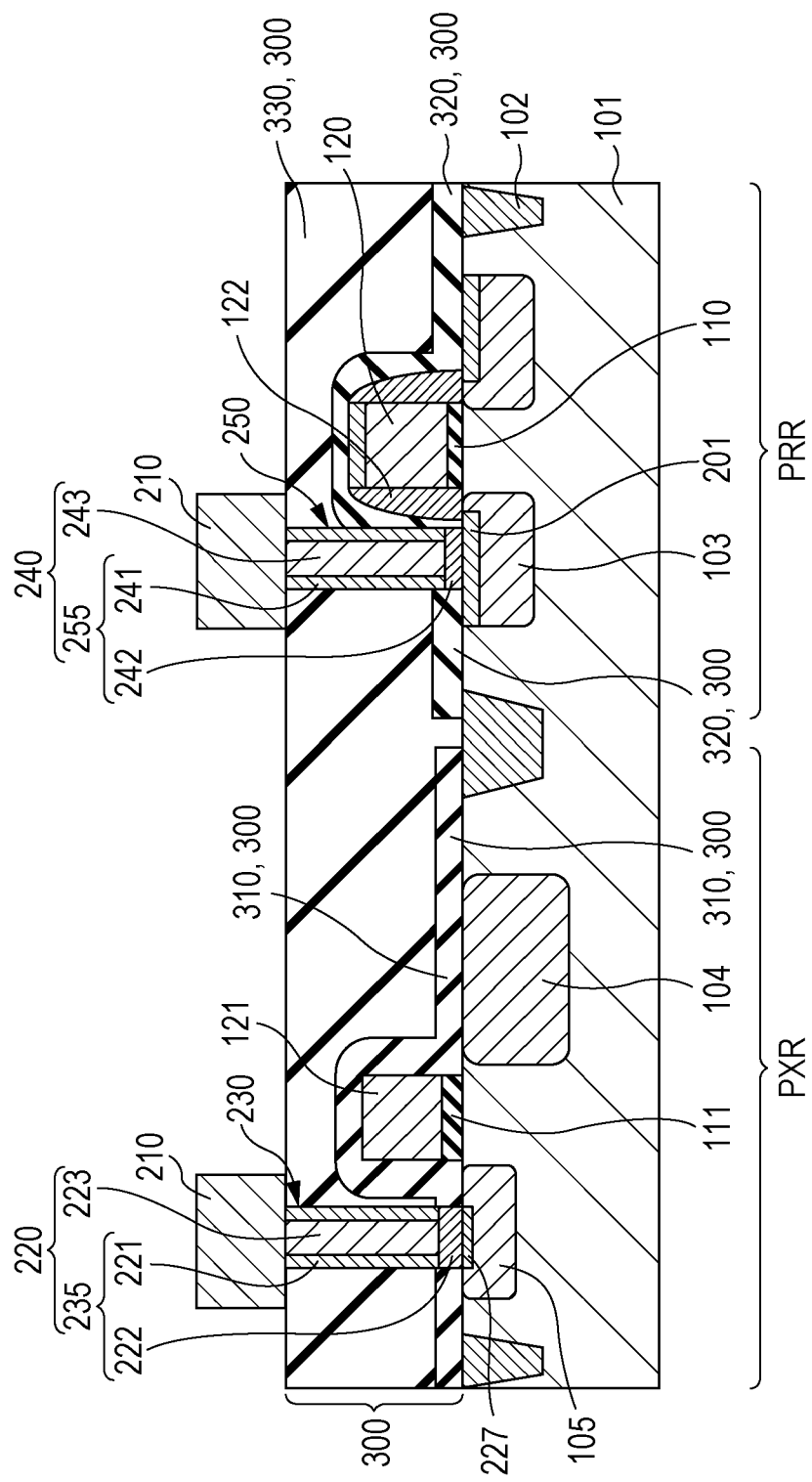

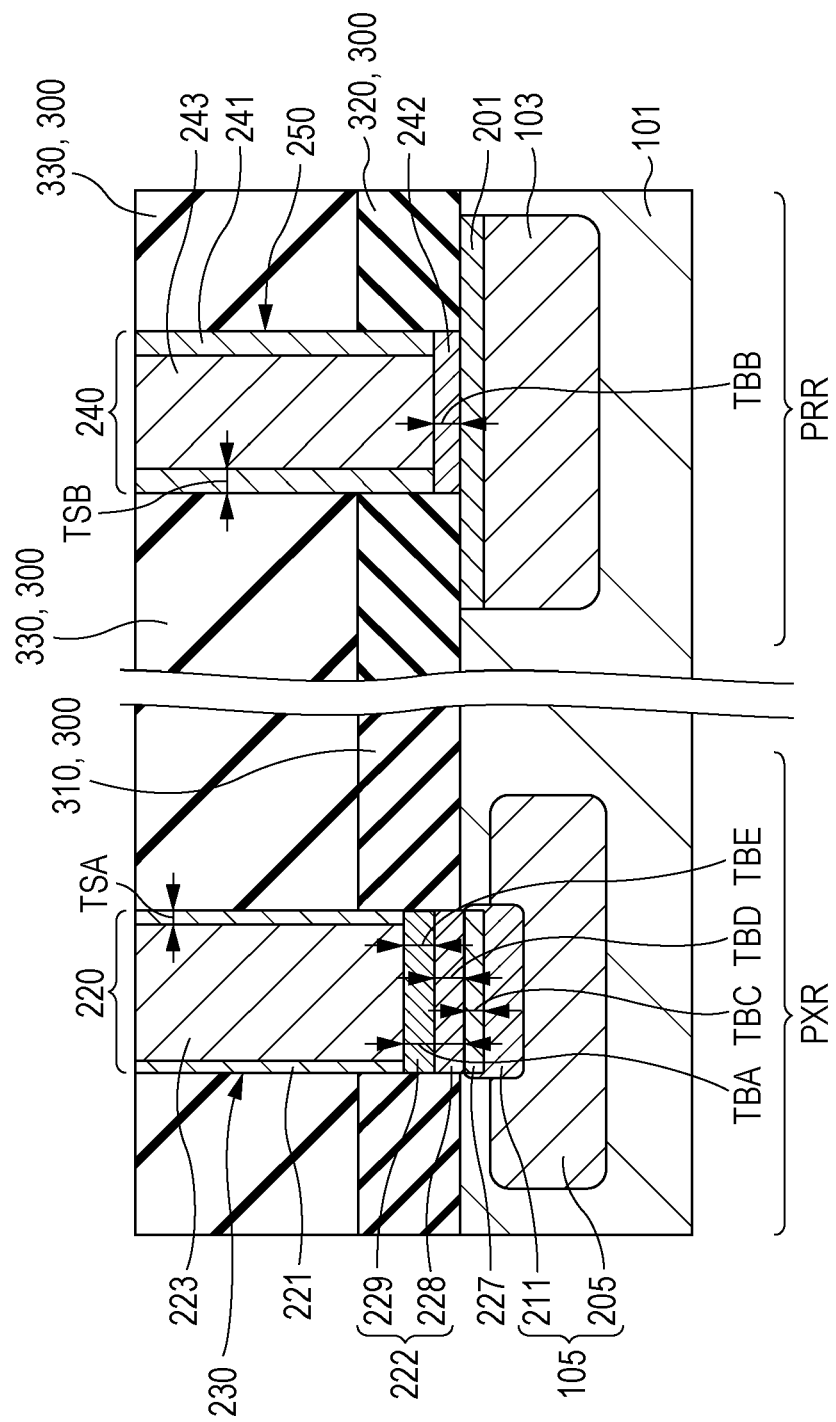

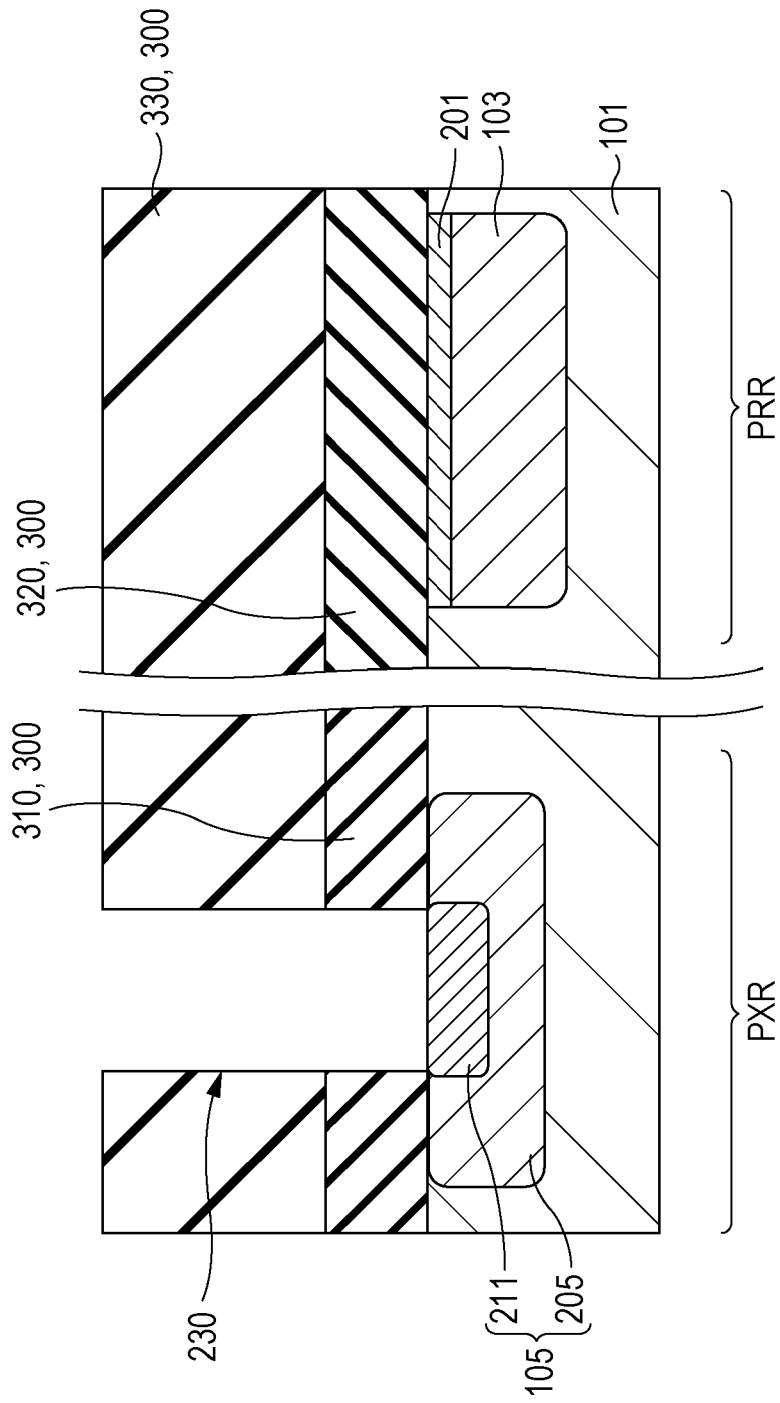

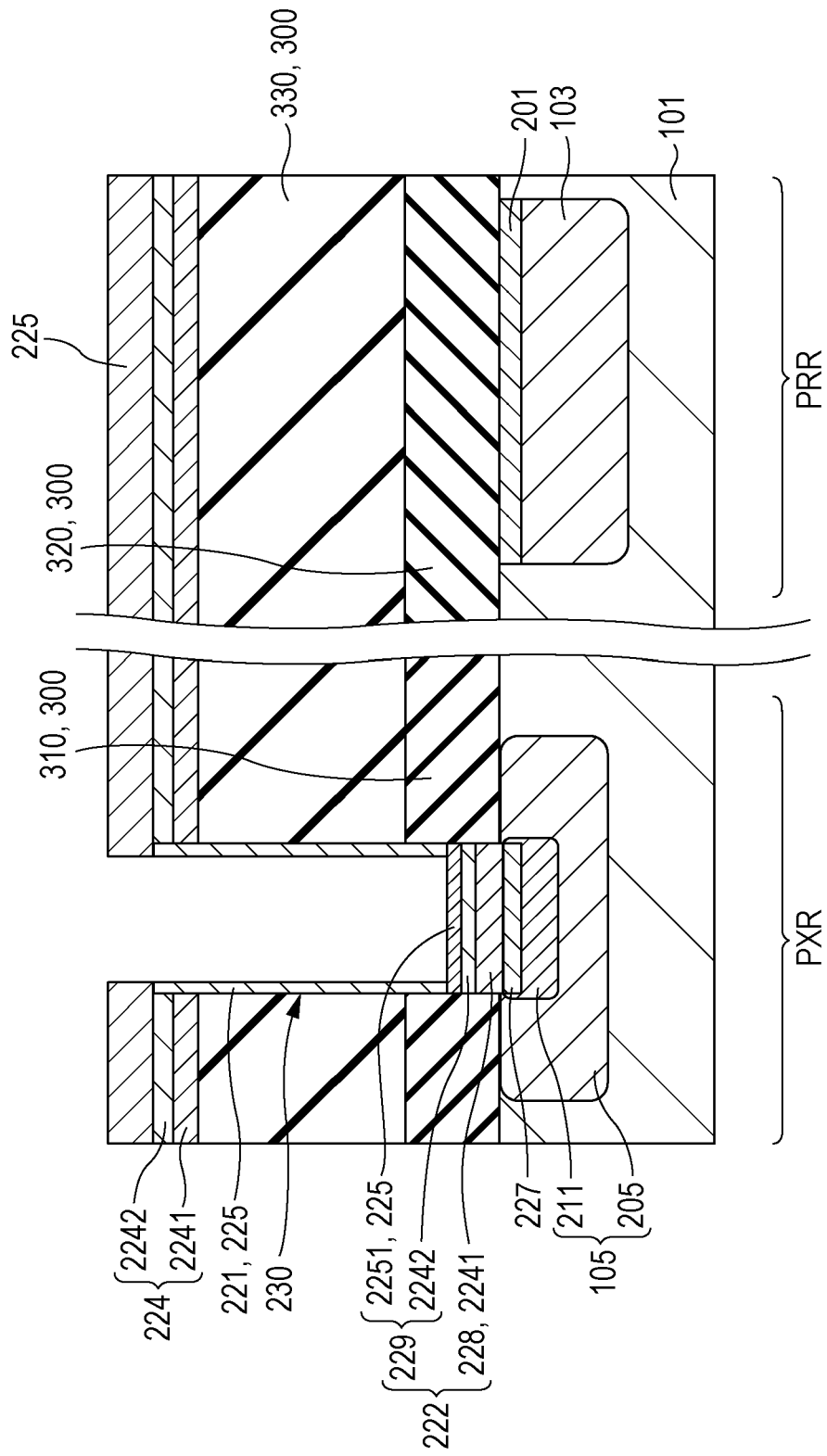

SEMICONDUCTOR APPARATUS, SYSTEM, AND METHOD OF PRODUCING SEMICONDUCTOR APPARATUS

BACKGROUND OF THE INVENTION

Field of the Invention

The present disclosure relates to a semiconductor apparatus.

Description of the Related Art

A semiconductor apparatus employs a contact plug for connecting between a semiconductor layer and a wiring layer. The contact plug is formed by filling a contact hole formed in an interlayer insulating film with a barrier metal material and a metal material.

Japanese Patent Laid-Open No. 2014-90051 discloses a semiconductor apparatus including a first semiconductor region not covered with a metal silicide layer and a second semiconductor region covered with a metal silicide layer under an interlayer insulating film. This patent literature discloses that the semiconductor apparatus includes a layer having a composition of $Ti_xSi_{1-x}$ (0<x<0.15) on the first semiconductor region.

SUMMARY OF THE INVENTION

A first aspect of the present disclosure provides a semiconductor apparatus including a silicon layer having a first semiconductor region and a second semiconductor region; an insulator film disposed on the silicon layer and having a first hole positioned on the first semiconductor region and a second hole positioned on the second semiconductor region; a first metal portion disposed in the first hole and containing a first metal element; a first conductor portion disposed between the first metal portion and the first semiconductor region and containing a second metal element different from the first metal element; a first silicide region disposed between the first conductor portion and the first semiconductor region and containing the second metal element; a second metal portion disposed in the second hole and containing the first metal element; a second conductor portion disposed between the second metal portion and the second semiconductor region and containing the second metal element; and a second silicide region disposed between the second conductor portion and the second semiconductor region and containing a third metal element different from the first metal element and different from the second metal element, wherein the thickness of the first conductor portion is larger than the thickness of the first silicide region and larger than the thickness of the second conductor portion.

A second aspect of the present disclosure provides a semiconductor apparatus including a silicon layer having a first semiconductor region and a second semiconductor region; an insulator film disposed on the silicon layer and having a first hole positioned on the first semiconductor region and a second hole positioned on the second semiconductor region; a first contact plug disposed in the first hole; a second contact plug disposed in the second hole; a first silicide region disposed between the first contact plug and the first semiconductor region; and a second silicide region disposed between the second contact plug and the second semiconductor region and between the insulator film and the second semiconductor region, wherein the first contact plug includes a first metal portion and a first barrier metal portion; the second contact plug includes a second metal portion and a second barrier metal portion; and the first barrier metal portion includes a first portion positioned between the first metal portion and the first silicide region, the first barrier metal portion includes a second portion positioned between the second metal portion and the second silicide region, and the thickness of the first portion is larger than the thickness of the first silicide region and larger than the thickness of the second portion.

A third aspect of the present disclosure provides a method of producing a semiconductor apparatus. The method includes a step of preparing a member including a silicon layer having a first semiconductor region and a second semiconductor region, an insulator film covering the first semiconductor region and the second semiconductor region, and a silicide region disposed between the second semiconductor region and the insulator film; a step of forming a first conductor film in a first hole formed in the insulator film on the first semiconductor region by one of physical vapor deposition and chemical vapor deposition; a step of forming a second conductor film in the first hole by the other of the physical vapor deposition and the chemical vapor deposition; a step of forming a metal film in the first hole in which the first conductor film and the second conductor film are formed; and a step of forming a third conductor film in a second hole formed in the insulator film on the silicide region so as to be brought into contact with the silicide region by chemical vapor deposition.

Further features of the present disclosure will become apparent from the following description of exemplary embodiments with reference to the attached drawings.

BRIEF DESCRIPTION OF THE DRAWINGS

FIGS. 2A to 2D are schematic diagrams illustrating a semiconductor apparatus.

FIGS. 4F-1 to 4J-1 and 4F-2 to 4J-2 are schematic diagrams illustrating a method of producing a semiconductor apparatus.

DESCRIPTION OF THE EMBODIMENTS

In Japanese Patent Laid-Open No. 2014-90051, the difference between the contact plug on the first semiconductor region and the contact plug on the second semiconductor region is only whether a layer having a composition of $Ti_xS_{1-x}$ is present or not. Accordingly, the electrical properties of the contact plugs each connected to the corresponding semiconductor regions are not individually optimized, leading to insufficient improvement in the performance of the semiconductor apparatus.

Accordingly, this embodiment optimizes the electrical properties of contact plugs each connected to corresponding semiconductor regions to improve the performance of a semiconductor apparatus.

The embodiment can provide a technique advantageous for improving the performance of a semiconductor apparatus.

Embodiments implementing the present disclosure will now be described with reference to the drawings. In the following description and drawings, a structure common to a plurality of drawings is denoted by the same reference mark. Accordingly, the common structure may be described with mutual reference to the drawings without specifying. The description of the structure denoted by the same reference mark may be omitted.

Semiconductor Apparatus

Figure 1A:
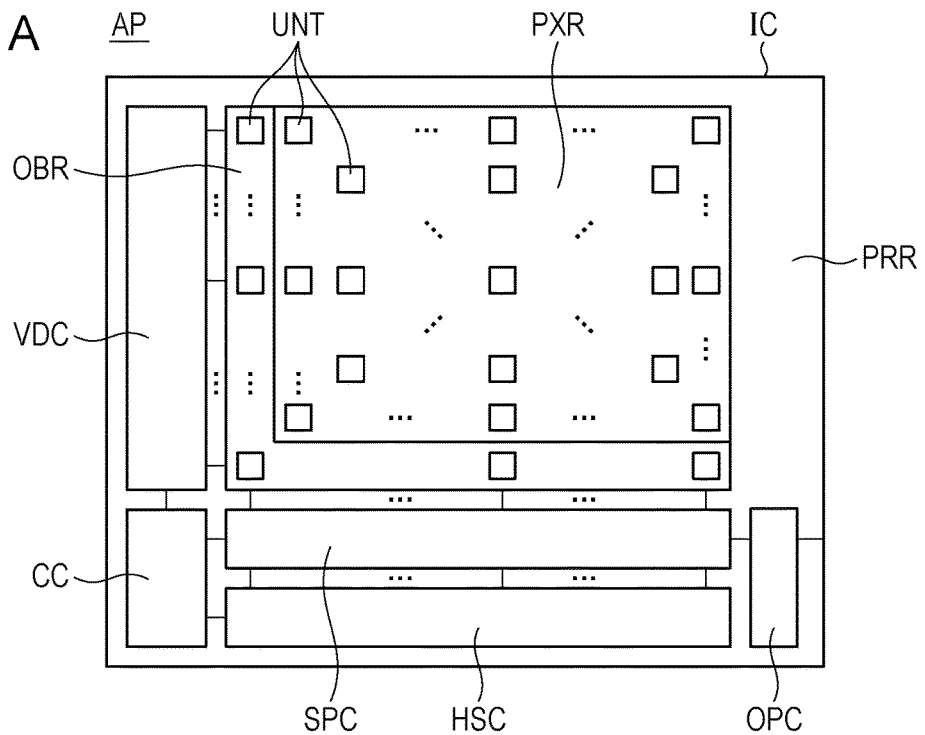
FIGS. 1A to 1C are schematic diagrams illustrating a semiconductor apparatus.

A structure of a semiconductor apparatus AP will be described with reference to FIG. 1A. The semiconductor apparatus AP in this embodiment is a photoelectric conversion apparatus and is an image pickup apparatus. The semiconductor apparatus AP is typically a CMOS image sensor. The semiconductor apparatus AP includes a plurality of pixel units UNT in a semiconductor chip IC. The pixel units UNT each includes a pixel circuit including a photoelectric conversion element disposed in a silicon layer. The pixel units UNT can each include optical elements such as a microlens, a color filter, an interlayer lens, and an optical waveguide. The pixel units UNT are disposed in a light receiving area PXR and a light shielding area OBR of the semiconductor apparatus AP. The light receiving area PXR and the light shielding area OBR can be collectively called a pixel area. The pixel unit UNT can be called a photoelectric conversion unit, and the pixel circuit can be called a photoelectric conversion circuit.

The semiconductor apparatus AP can include a peripheral area PRR in the outer side of the light receiving area PXR and the light shielding area OBR. The peripheral area PRR can include a peripheral circuit performing at least one of driving of the pixel unit UNT and processing the signals output from the pixel unit UNT. The details of the peripheral circuit are described later.

Figure 1B:
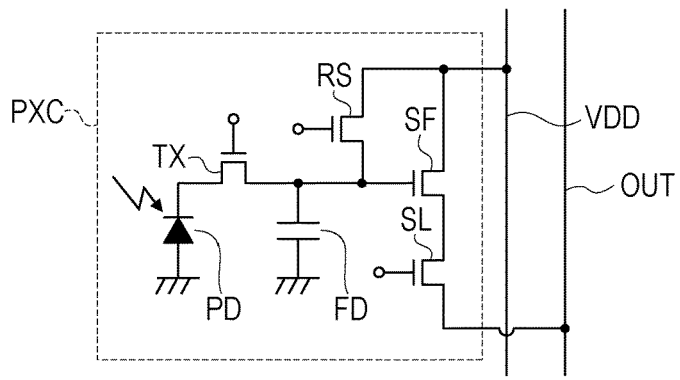

FIG. 1B shows an example of circuit arrangement of one pixel circuit PXC in the pixel area PXR. The pixel circuit PXC is composed of a plurality of pixel transistors. Herein, a transfer transistor TX, an amplification transistor SF, a selection transistor SL, and a reset transistor RS are insulated-gate field-effect transistors. The insulated-gate field-effect transistor is typically a MOS transistor. In this example, the transfer transistor TX and all pixel transistors are N-type MOS transistors. However, the pixel circuit PXC may be composed of both N-type and P-type MOS transistors or may be composed of only P-type MOS transistors. Alternatively, at least one of the transistors constituting the pixel circuit PXC may be a transistor that is not an insulated-gate field-effect transistor, for example, may be a junction field-effect transistor (JFET) or a bipolar transistor.

The gate of the transfer transistor TX functions as a charge transfer unit transferring a signal electric charge generated in a photoelectric conversion unit PD to a charge detection unit FD. The photoelectric conversion unit PD is composed of a photodiode and functions as a source of the transfer transistor TX. A charge detection unit FD is composed of a floating diffusion (floating diffusion region) and functions as a drain of the transfer transistor TX. The charge detection unit FD is connected to the gate of the amplification transistor SF, a power supply line VDD is connected to a drain of the amplification transistor SF, and an output line OUT is connected to a source of the amplification transistor SF. The amplification transistor SF constitutes a source follower circuit and outputs a signal according to the potential of the charge detection unit FD to the output line OUT. The selection transistor SL switches ON/OFF of the output from the pixel circuit PXC. The reset transistor RS resets the potential of the charge detection unit FD to a reset potential. In this example, the potential supplied from the power supply line VDD is used as the reset potential. In addition to the transfer transistor TX, the amplification transistor SF, and the reset transistor RS, the pixel circuit PXC can include a switch transistor switching the capacity of the charge detection unit FD. Alternatively, the signal processing circuit disposed in each column of the pixel circuit PXC may be partially incorporated into the pixel circuit PXC.

Figure 1C:
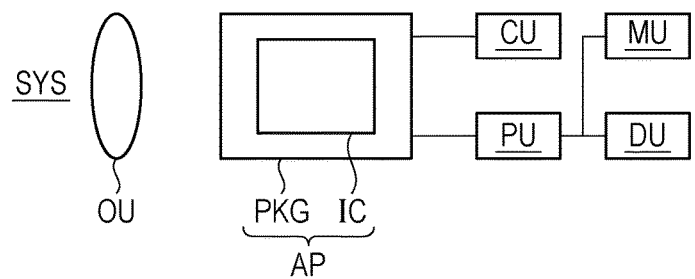

FIG. 1C shows an example of the structure of an image pickup system SYS including the semiconductor apparatus AP. The image pickup system SYS can further include at least one of an optical unit OU, a control unit CU, a processing unit PU, a display unit DU, and a memory unit MU. The image pickup system SYS is typically a camera. The details of the image pickup system SYS are described later.

Figure 2A:
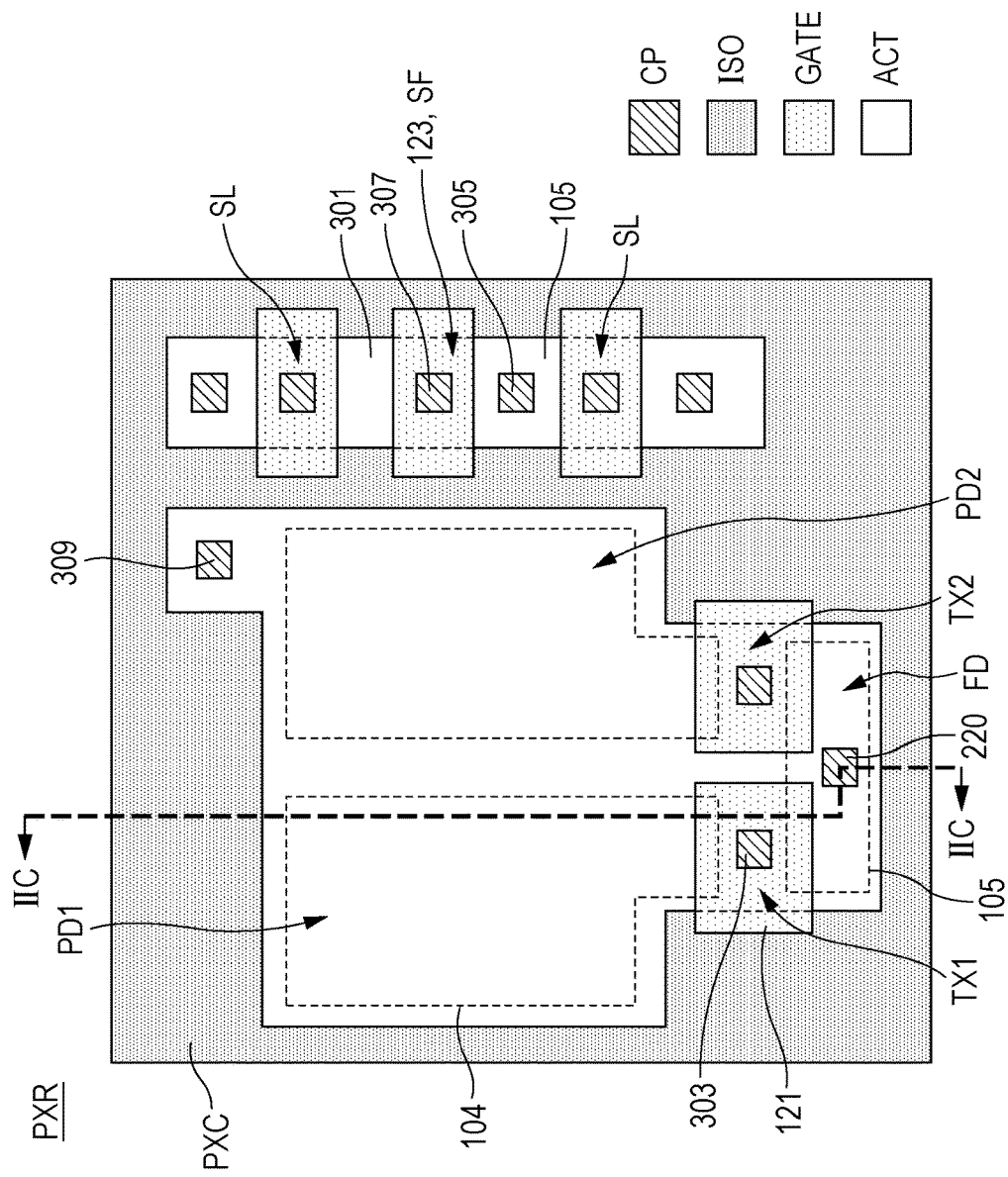
Figure 2B:
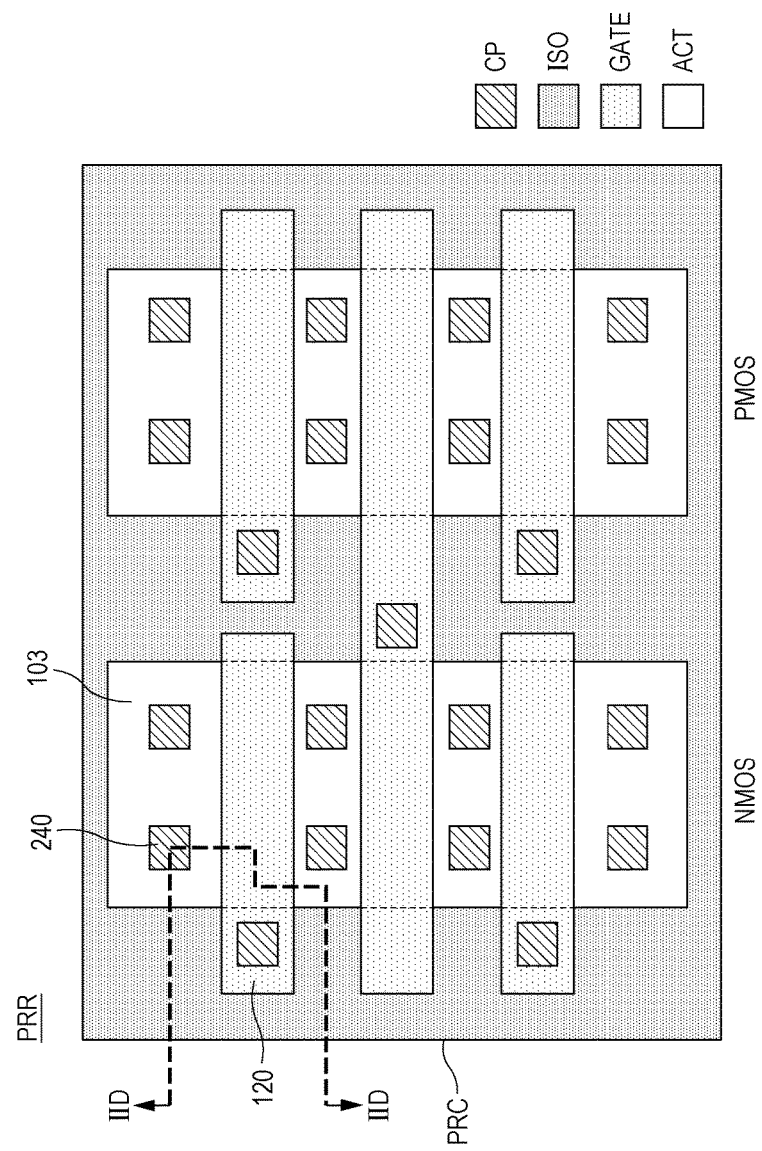

FIG. 2A shows an exemplary layout of the pixel circuit PXC, and FIG. 2B shows an exemplary layout of the peripheral circuit PRC. In FIGS. 2A and 2B, "CP" indicates the position of a contact plug, "ISO" indicates the position of an element isolation region, "GATE" indicates the position of a gate electrode, and "ACT" indicates the position of an element region. The pixel area PXR in FIG. 2C is a cross-sectional view taken along the line IIC-IIC in FIG. 2A. The peripheral area PRR in FIG. 2D is a cross-sectional view taken along the line IID-IID in FIG. 2B.

The pixel area PXR includes a plurality of contact plugs CP including contact plugs 220, 303, 305, 307, and 309. The contact plug 220 is connected to a semiconductor region 105 serving as a drain of a transfer transistor TX. The contact plug 305 is connected to a drain of a pixel transistor PX. The contact plug 303 is connected to a gate electrode 121 of the transfer transistor TX. The contact plug 301 is connected to a gate electrode 123 of the pixel transistor PX. The contact plug 309 is connected to a P-type semiconductor region serving as an anode of a photoelectric conversion unit PD serving as a photodiode.

As shown in FIG. 2A, the contact plug CP connected to the gate electrode in the pixel area PXR is disposed on the element region, and the element region ACT under the contact plug CP is a channel region. The layout of the pixel circuit can be miniaturized by thus-arranging the contact plug CP on the channel region. Instead of this method, the gate electrode GATE may be extended onto the element isolation region ISO, and the contact plug CP may be arranged on the extended portion. In such a case, although the layout cannot be miniaturized, the damage on the channel region is reduced to decrease the noise. Even if a contact plug is arranged on the element isolation region ISO, the amount of the gate electrode GATE extending on the element isolation region ISO can be reduced by employing a thin contact plug, leading to an advantage for miniaturization.

The pixel circuit PXC of this example includes a plurality of photoelectric conversion units PD1 and PD2 isolated from each other with an isolation region. The charges of the photoelectric conversion units PD1 and PD2 can be transferred at different timing to a charge detection unit FD by a plurality of change transfer units TX1 and TX2 isolated from each other. Consequently, the pixel circuit of this example can detect the focus or survey the distance by a divided-pupil phase difference detection system. Although the charge transfer units TX1 and TX2 in this example are constituted so as to transfer charges to a common charge detection unit FD, the charge transfer units TX1 and TX2 may be constituted so as to transfer charges to different respective charge detection units.

FIG. 2C shows a cross-section including a transfer transistor in the pixel circuit PXC and a peripheral transistor in the peripheral circuit PRC formed in a silicon layer 101. In this example, although a transfer transistor in the pixel area and an n-type MOS transistor in the peripheral area described below are shown, other transistors (not shown) can also have the same structure.

The silicon layer 101 is, for example, a single crystalline silicon layer formed by epitaxial growth on a single crystalline silicon substrate. In the pixel circuit PXC, the silicon layer 101 is provided with a semiconductor region 104 that functions as a cathode of a photoelectric conversion unit PD serving as a photodiode and also functions as a source of a transfer transistor. Furthermore, in the pixel circuit PXC, the silicon layer 101 is provided with a semiconductor region 105 that serves as a drain of a transfer transistor functioning as a charge detection unit FD. A gate electrode 121 of the transfer transistor is disposed on the channel region, with a gate insulating film 111 therebetween, between the semiconductor region 104 serving as a source and the semiconductor region 105 serving as a drain. The gate of the transfer transistor has a MOS structure constituted of the gate electrode 121, the gate insulating film 111, and the silicon layer 101 (channel region).

In the element isolation region 102, an insulator for element isolation is disposed in a groove formed in the silicon layer 101. Although the element isolation region 102 of this example thus has an STI structure, an LOCOS structure may be employed, or a PN-junction isolation structure may be employed without using any insulator.

On the silicon layer 101, a third insulator layer 330 is disposed so as to extend from the pixel area PXR to the peripheral area PRR. In the pixel circuit PXC, a first insulator layer 310 covering the pixel transistor (transfer transistor) is disposed between the silicon layer 101 and the third insulator layer 330. In the peripheral area PRR, a second insulator layer 320 covering the peripheral transistor is disposed between the silicon layer 101 and the third insulator layer 330. The second insulator layer 320 does not cover the transfer transistor and the pixel transistor, but the first insulator layer 310 and the second insulator layer 320 may overlap with each other. A multilayer film including the first insulator layer 310, the second insulator layer 320, and the third insulator layer 330 is an insulator film 300. For example, the first insulator layer 310 and the second insulator layer 320 are layers containing silicon (Si) and nitrogen (N) (silicon nitride layers), and the third insulator layer 330 is a layer containing silicon (Si) and oxygen (O). The insulator film 300 can further include a layer containing silicon (Si) and oxygen (O) (silicon oxide layer) positioned between the first insulator layer 310 and the silicon layer 101 and/or between the second insulator layer 320 and the silicon layer 101.

The pixel circuit PXC is provided with a contact plug 220 penetrating through the third insulator layer 330 and the first insulator layer 310. The contact plug 220 is connected to the semiconductor region 105 serving as a drain of the transfer transistor and functioning as a floating diffusion region. The semiconductor region 105 includes an N-type impurity region 205 having a low impurity concentration positioned under the insulator film 300 and an N-type high-concentration impurity portion 211 having a high impurity concentration positioned under the contact plug 220. The high-concentration impurity portion 211 has an impurity concentration higher than that of the impurity region 205. Consequently, the contact resistance between the semiconductor region 105 and the contact plug 220 can be reduced.

The peripheral circuit PRC is provided with a contact plug 240 penetrating through the third insulator layer 330 and the second insulator layer 320. The contact plug 240 is connected to the silicide region 201 formed on the N-type semiconductor region 103 constituting the source-drain of the n-type MOS transistor.

On the third insulator layer 330, a plurality of wiring layers 210 including respective conductive patterns each connected to corresponding contact plugs is disposed. A front illuminated image pickup apparatus can be constituted by optionally forming a plurality of wiring layers, a color filter array, and a microlens array on the third insulator layer 330 and the wiring layers 210. Alternatively, a back side illuminated image pickup apparatus can be constituted by providing a color filter array and a microlens array to the silicon layer 101 on the opposite side to the wiring layers.

The contact plug 220 of the pixel circuit PXC disposed in the pixel area PXR is disposed in the hole 230 formed in the insulator film 300. The hole 230 can be called a contact hole. The hole 230 penetrates through the third insulator layer 330 and the first insulator layer 310. The side face of the hole 230 is constituted of the insulator film 300 (the first insulator layer 310 and the third insulator layer 330).

The contact plug 220 includes a metal portion 223 containing a metal element Me1 as a main component. The metal portion 223 is disposed in the hole 230. The contact plug 220 includes a conductor portion 221 containing a metal element Me2 different from the metal element Me1. The conductor portion 221 is disposed between the metal portion 223 and the insulator film 300 forming the side face of the hole 230. The contact plug 220 includes a conductor portion 222 containing a metal element Me2 different from the metal element Me1. The conductor portion 222 is disposed between the metal portion 223 and the semiconductor region 105.

A silicide region 227 containing the metal element Me2 as a metal component is disposed between the conductor portion 222 and the semiconductor region 105. The insulator film 300 (the first insulator layer 310) is in contact with the semiconductor region 105.

The contact plug 240 of the peripheral circuit PRC disposed in the peripheral area PRR is disposed in the hole 250 formed in the insulator film 300. The hole 250 can be called a contact hole. The hole 250 penetrates through the third insulator layer 330 and the second insulator layer 320. The side face of the hole 250 is constituted of the insulator film 300 (the second insulator layer 320 and the third insulator layer 330).

The contact plug 240 includes a metal portion 243 containing a metal element Me1 as a main component. The metal portion 243 is disposed in the hole 250. The contact plug 240 includes a conductor portion 241 containing a metal element Me2 different from the metal element Me1. The conductor portion 241 is disposed between the metal portion 243 and the insulator film 300 forming the side face of the hole 250. The contact plug 240 includes a conductor portion 242 containing a metal element Me2 different from the metal element Me1. The conductor portion 242 is disposed between the metal portion 243 and the semiconductor region 103.

The conductor portion 221, 241 is positioned at least between the third insulator layer 330 and the metal portion 223, 243 in the insulator film 300. The distance from the boundary between the conductor portion 222 and the metal portion 223 to the silicon layer 101 can be shorter than the distance from the boundary between the first insulator layer 310 and the third insulator layer 330 to the silicon layer 101. Accordingly, the conductor portion 221 can have a portion positioned between the metal portion 223 and the first insulator layer 310. The distance from the boundary between the conductor portion 242 and the metal portion 243 to the silicon layer 101 can be shorter than the distance from the boundary between the second insulator layer 320 and the third insulator layer 330 to the silicon layer 101. Accordingly, the conductor portion 241 can have a portion positioned between the metal portion 243 and the second insulator layer 320. Consequently, an increase in the resistance of the contact plug 220, 240 due to the resistance of the conductor portion 222, 242 itself can be suppressed.

A silicide region 201 containing a metal element Me3, different from the metal element Me2, as a metal component is disposed between the conductor portion 242 and the semiconductor region 103. The silicide region 201 is also disposed between the insulator film 300 (the second insulator layer 320) and the semiconductor region 103, and the insulator film 300 (the second insulator layer 320) is in contact with the silicide region 201.

In this example, the metal element Me1 is tungsten (W), the metal element Me2 is titanium (Ti), and the metal element Me3 is cobalt (Co). The metal element Me3 may be nickel (Ni) instead of cobalt (Co). The metal element Me1 may be aluminum (Al), gold (Au), silver (Ag), or copper (Cu), instead of tungsten (W). The metal element Me2 may be tantalum (Ta), instead of titanium (Ti). The metal element Me3 may be titanium (Ti), tungsten (W), molybdenum (Mo), tantalum (Ta), chromium (Cr), palladium (Pd), or platinum (Pt). The metal element Me1, the metal element Me2, and the metal element Me3 may be selected from these candidates such that they are different from one another. The term "silicide" refers to s metal compound (metal silicide) containing silicon (Si) and a metal element Me3.

The compositions and element concentrations of the contact plug 220, 240, the silicide region 227, 201, and the semiconductor region 105, 103 can be determined by an EDS method or an EELS method. These analyses demonstrate that the boundary between the silicide region 227, 201 and the semiconductor region 105, 103 and the boundary between the silicide region 227, 201 and the conductor portion 222, 242 are unclear in some cases. Conveniently, the silicide region 227, 201 and the semiconductor region 105, 103 can be defined as a region having a silicon concentration of 5.0 at % or more and the conductor portion 222, 242 can be defined as a region having a silicon concentration of less than 5.0 at % to distinguish them from each other. Conveniently, the silicide region 227, 201 and the conductor portion 222, 242 can be defined as a region having a metal element Me2 or Me3 concentration of 5.0 at % or more. Accordingly, the silicide region 227, 201 can be defined as a region having a silicon concentration and a metal element Me2 or Me3 concentration that are each 5.0 at % or more. The maximum concentration of the metal elements Me2 or Me3 in the silicide region 227, 201 can be 30 at % or more.

The conductor portion 221 and the conductor portion 222 can each have a resistivity higher (a conductivity lower) than that of the metal portion 223. The conductor portion 241 and the conductor portion 242 can have a resistivity higher (a conductivity lower) than that of the metal portion 243. For example, titanium has a resistivity about 5 to 15 times that of tungsten, although it varies depending on the film forming conditions. Although a typical metal compound, such as a nitride, oxide, or carbide of a metal, has a resistivity higher than that of the simple substance of the metal, some of metal silicides have a resistivity lower than that of the simple substance of the metal and some of metal silicates have a resistivity higher than that of the simple substance of the metal. Furthermore, metal silicates can have highly different resistivities depending on the composition even if the metal component is the same. The resistivity order in typical combinations of metal elements is as follows: W<TiSi<CoSi<Ti<TiN<Si.

The diffusion coefficient of the metal element Me2 into the insulator film 300 (in particular, the third insulator layer 330) can be lower than that of the metal element Me1 into the insulator film 300 (in particular, the third insulator layer 330). When such diffusion coefficients are satisfied, a material containing the metal element Me2 can function as a barrier metal against the metal element Me1.

The conductor portion 221 and the conductor portion 222 containing the metal element Me2 are collectively called a barrier metal portion 235. The metal portion 223 and the barrier metal portion 235 constitute the contact plug 220. The conductor portion 241 and the conductor portion 242 containing the metal element Me2 are collectively called a barrier metal portion 255. The metal portion 243 and the barrier metal portion 255 constitute the contact plug 240. The combination of the material of the metal portion 223 and the material of the barrier metal portion 235 in the contact plug 220 may be different from the combination of the material of the metal portion 243 and the material of the barrier metal portion 255 in the contact plug 240. FIG. 2D is an enlarged view of the vicinity of the conductor portion 222, 242. FIG. 2D shows the thickness TBA of the conductor portion 222 and the thickness TSA of the conductor portion 221 of the contact plug 220 of the pixel circuit PXC. FIG. 2D also shows the thickness TBB of the conductor portion 242 and the thickness TSB of the conductor portion 241 of the contact plug 240 of the peripheral circuit PRC.

Herein, the thickness TBA of the conductor portion 222 of the contact plug 220 of the pixel circuit PXC does not include the thickness TBC of the silicide region 227. The thickness TBB of the conductor portion 242 of the contact plug 240 of the peripheral circuit PRC does not include the thickness TBD of the silicide region 201.

One of the characteristics of this embodiment is that the thickness TBA of the conductor portion 222 is larger than the thickness TBB of the conductor portion 242 (TBA>TBB). The thickness TBA can also be expressed as the distance between the metal portion 223 and the silicide region 227. The thickness TBB can also be expressed as the distance between the metal portion 243 and the silicide region 201.

The resistance of the contact plug 220 is increased by increasing the thickness TBA of the conductor portion 222. This is more effective when the conductor portion 222 has a resistivity higher than that of the metal portion 223, compared to other cases. Consequently, the variation in the resistivity of the contact plug 220 in the pixel area PXR can be reduced. In the pixel area PXR, a variation in the electrical properties of the pixel circuit PXC causes a variation in the pixel signals, leading to a reduction in image quality, such as image unevenness. Accordingly, in the pixel area PXR, it is effective to reduce the variation in the resistance of the contact plug 220 for each pixel circuit PXC. In contrast, the resistance of the contact plug 242 in the peripheral area PRR is decreased by reducing the thickness TBB of the conductor portion 242. This is more effective when the conductor portion 242 has a resistivity higher than that of the metal portion 243, compared to other cases. Consequently, the operating speed of the peripheral circuit PRC can be increased. The electrical properties of the contact plug 220, 240 can be thus optimized in the pixel area PXC and the peripheral area PRC. The electrical properties of the contact plug 220, 240 include the contact resistance between the contact plug 220, 240 and the semiconductor region 105, 103.

The silicide region 227 can have a resistivity higher than that of the conductor portion 222. Accordingly, the thickness TBC of the silicide region 227 can be smaller than that the thickness TBA of the conductor portion 222 (TBC<TBA). An increase in the contact resistance of the contact plug 220 due to the resistance of the silicide region 227 itself can be suppressed by decreasing the thickness of the silicide region 227 as much as possible. The resistivity of the silicide region 227 is readily changed depending on the composition, and the composition is difficult to be controlled during the formation of the silicide region 227. Accordingly, the variation in the contact resistance due to the variation in the composition of the silicide region 227 can be reduced by decreasing the thickness of the silicide region 227 as much as possible. A reduction in the thickness of the silicide region 227 can prevent the metal element Me2 in the silicide region 227 from diffusing into the semiconductor region 105 and thereby can prevent occurrence of a leakage current and a white flaw.

The thickness TSA of the conductor portion 221 can be smaller than the thickness TSB of the conductor portion 241 (TSA<TSB) by reducing the resistance of the metal portion 223 or decreasing the width of the contact plug 220. From the viewpoint of a reduction in contact resistance, the thickness TBA of the conductor portion 222 of the contact plug 220 in the pixel circuit PXC can be larger than the thickness TSA of the conductor portion 221 (TBA>TSA). From the viewpoint of a reduction in the resistance of the contact plug 240 itself, the thickness TSB of the conductor portion 241 of the contact plug 240 in the peripheral circuit PRC can be smaller than or equal to the thickness TBB of the conductor portion 242 (TSB≤TBB).

Based on the above, the ratio of the thickness TBA of the conductor portion 222 to the thickness TSA of the conductor portion 221 can be larger than the ratio of the thickness TBB of the conductor portion 242 to the thickness TSB of the conductor portion 241 (TBA/TSA>TBB/TSB).

The conductor portion 222 can have a layered structure of the metal layer 228 of a simple substance or an alloy of a metal element Me2 and a metal compound layer 229 of a compound of the metal element Me2. The metal layer 228 is disposed contiguous to the silicide region 227, and the metal compound layer 229 is disposed between the metal layer 228 and the metal portion 223. The compound of the metal element Me2 contained in the metal compound layer 229 is typically a nitride, a carbide, or an oxide and more typically a nitride. In this example, the metal element Me2 is titanium (Ti), the metal layer 228 is a titanium (Ti) layer, and the metal compound layer 229 is a titanium nitride (TiN) layer.

As in the conductive portion 222, the conductor portion 242 also can have a layered structure composed of a metal layer of a simple substance of a metal element Me2 and a metal compound layer of a compound of the metal element Me2, but the layered structure of the conductor portion 242 is omitted in FIG. 2D. In also the conductor portion 242, the metal layer can be disposed contiguous to the silicide region 201, and the metal compound layer can be disposed between the metal layer and the metal portion 243.

The concentration of the metal element Me2 in the metal layer 228 can be higher than the concentration of the metal element Me2 in the metal compound layer 229 and/or the concentration of the metal element Me2 in the metal layer of the conductor portion 242. The concentration of the metal element Me2 in the metal layer 228 can be higher than that in the silicide region 227. The thickness TBD of the metal layer 228 can be larger than the thickness TBC of the silicide region 227 (TBD>TBC). The thickness TBE of the metal compound layer 229 can be larger than the thickness TBC of the silicide region 227 (TBE>TBC). The thickness TBE of the metal compound layer 229 need not be larger than the thickness TBD of the metal layer 228 (TBD≥TBE).

The thickness order for optimizing the electrical properties of contact is, for example, TBA>TBD≥TBE>TSB≥TBB>TSA>TBC. The range of the thickness for optimizing the electrical properties of contact will be described. The thickness TBA is, for example, 10 nm or more, preferably 30 nm or more, and 120 nm or less, preferably 60 nm or less. The thickness TBB is, for example, 5 nm or more, preferably 10 nm or more, and 40 nm or less, preferably 20 nm or less. The thickness TBC is, for example, 1 to 10 nm. The thickness TBD is, for example, 10 to 60 nm. The thickness TBE is, for example, 10 to 60 nm. The thickness TSA is, for example, 1 nm or more and 20 nm or less. The thickness TSB is, for example, 5 nm or more, preferably 10 nm or more, and 40 nm or less, preferably 20 nm or less.

The contact resistance of the contact plug 220 in the pixel area PXR and the contact resistance of the contact plug 240 in the peripheral area PRR can be reduced by employing at least a part of the above described embodiments. As a result, the signal read-out speed of the pixel circuit and the operation speed of the peripheral circuit can be improved.

In particular, the electrical properties of the contact portion of the pixel circuit PXC and the electrical properties of the contact portion of the peripheral circuit PRR can be both improved by adjusting the thickness TBA of the conductor portion 222 in the contact plug 220 of the pixel area PXR and the thickness TBB of the conductor portion 242 in contact plug 240 of the peripheral area PRR such that the thickness TBA is larger than the thickness TBB.

For example, the contact resistance of the pixel area PXR is dominantly affected by the thickness of the silicide region 227 in the contact portion of the contact plug 220 and the impurity concentration in the semiconductor region 105 under the silicide region 227. Accordingly, a silicide region 227 sufficient for reducing the contact resistance can be formed by means of a thick conductor portion 222 of the contact plug 220 of the pixel circuit PXC.

Metal contamination of the photoelectric conversion unit PD of the pixel area PXR causes occurrence of deterioration in image quality through, for example, an increase in leakage current. Accordingly, in order to prevent metal contamination of the photoelectric conversion unit PD, the pixel area PXR can have a structure where the semiconductor region 105 serving as the drain of the transfer transistor is silicided only at the portion in contact with the conductor portion 222 of the contact plug 220. Herein, a silicide region formed on a part, not the whole, of the semiconductor region 105 can reduce the metal contamination sources and also can prevent the refractory metals from diffusing into the photoelectric conversion unit PD during the formation of the silicide region 227 and subsequent heat treatment. In addition, the diffusion of the metal element Me1 from the metal portion 223 into the semiconductor region 105 can be prevented by means of the thick conductor portion 222 of the contact plug 220.

At the same time, in the peripheral area PRR, a silicide region 201 is formed on the semiconductor region 103 for increasing the speed of the peripheral circuit PXC. Herein, the contact plug 240 of the peripheral area PRR is formed on the silicide region 201. Accordingly, the thickness TBB of the conductor portion 242 of the contact plug 240 can be small because the contact resistance itself is not so high. In addition, the conductor portions 241 and 242 can have resistivities higher than that of the metal portion 243. Accordingly, when the contact resistance of the contact plug 240 is sufficiently low, reductions in the thicknesses TSB and TBB of the conductor portions 241 and 242 as much as possible can increase the width of the metal portion 243 and reduce the resistance of the contact plug 240.

The structure similar to that of the contact plug 220 described above can be applied to every contact plug CP in the pixel area PXR shown in FIG. 2A. In addition, the contact plug 240 can be applied to every contact plug CP in the peripheral area PRR shown in FIG. 2B. The structure similar to that of the contact plug 220 or the contact plug 240 described above can be applied to the contact plug CP on the gate electrode GATE when the gate electrode includes a polycrystalline silicon layer and a silicide region similar to the silicide region 227, 201 on the polycrystalline silicon layer. However, the advantageous effects by the present embodiment are high in the contact plug CP connected to a single crystalline silicon layer, the silicon layer 101.

Any of the contact plugs in the pixel area PXR represented by the contact plug 220 may have a width different from that of any of the contact plugs in the peripheral area PRR represented by the contact plug 240. In particular, the width of a contact plug (for example, the contact plug 220) in the pixel area PXR can be smaller than the width of a contact plug (for example, the contact plug 240) in the peripheral area PRR. A reduction in the width of the contact plug in the pixel area PXR enhances the miniaturization of the pixel circuit PXC, allowing to increase the number of the pixels or to reduce the chip size. An increase in the width of the contact plug in the peripheral area PRR can reduce the resistance of the contact plug and increase the operation speed of the peripheral circuit PRC. The width of a contact plug is almost the same as that of the contact hole in which the contact plug is disposed. Accordingly, a width of the contact plug 220 smaller than that of the contact plug 240 is substantially the same as a width of the hole 230 smaller than that of the hole 250.

Method of Producing Semiconductor Apparatus

A method of producing a semiconductor apparatus will be described with reference to FIGS. 3A-1 to 3E-2 and 4F-1 to 4J-2 sequentially showing each step X (X=A to J) of the method of producing a semiconductor apparatus, wherein each step X is indicated by a branch number (X-1) of the drawing, and an enlarged view of the main section is indicated by a branch number (X-2).

In the description below, the term "CVD method" refers to chemical vapor deposition and includes a thermal CVD method and a plasma CVD method. Furthermore, an LPCVD method, an MOCVD method, and a metal CVD method belong to the thermal CVD method, and an HDP-CVD method belongs to the plasma CVD method. The term "PVD method" refers to physical vapor deposition and includes a sputtering method and a vapor deposition method.

Figures 1, 3A:
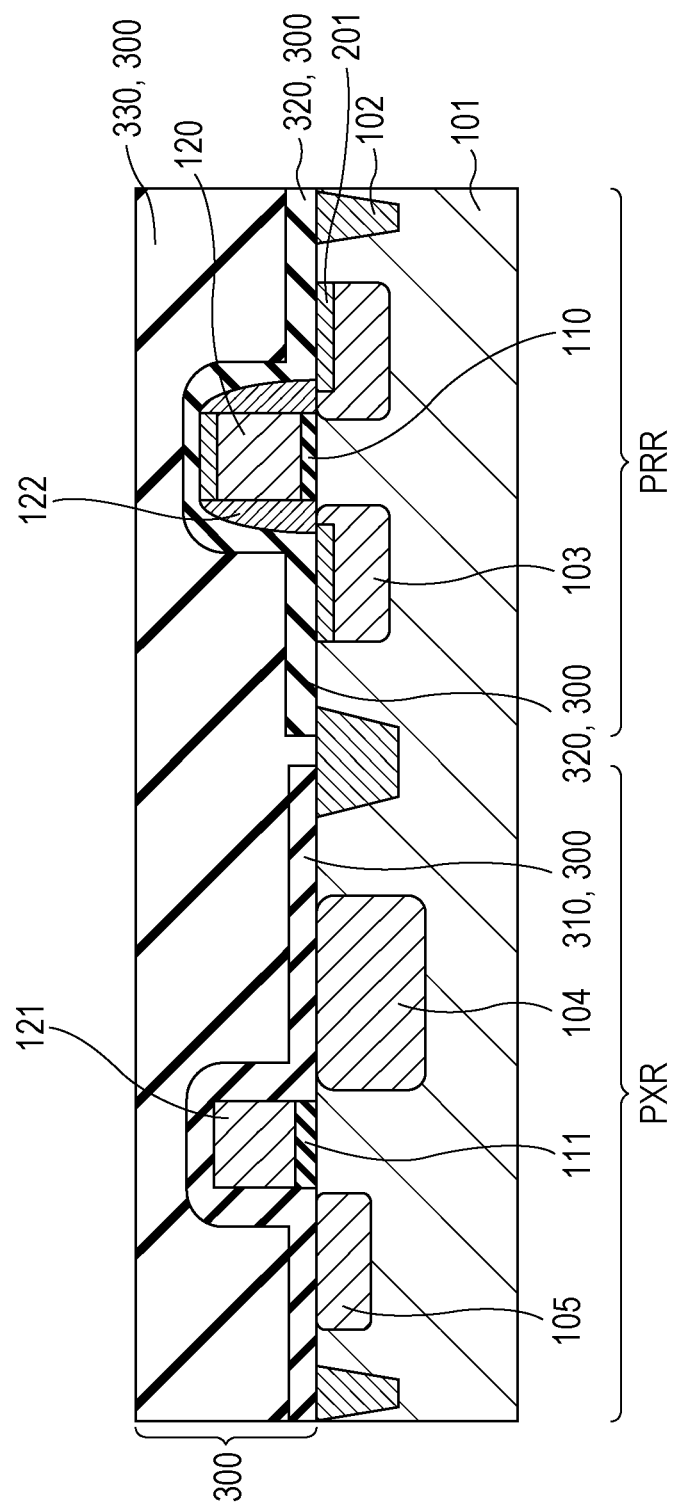
FIGS. 3A-1 to 3E-1 and 3A-2 to 3E-2 are schematic diagrams illustrating a method of producing a semiconductor apparatus.
Figures 2, 3A:
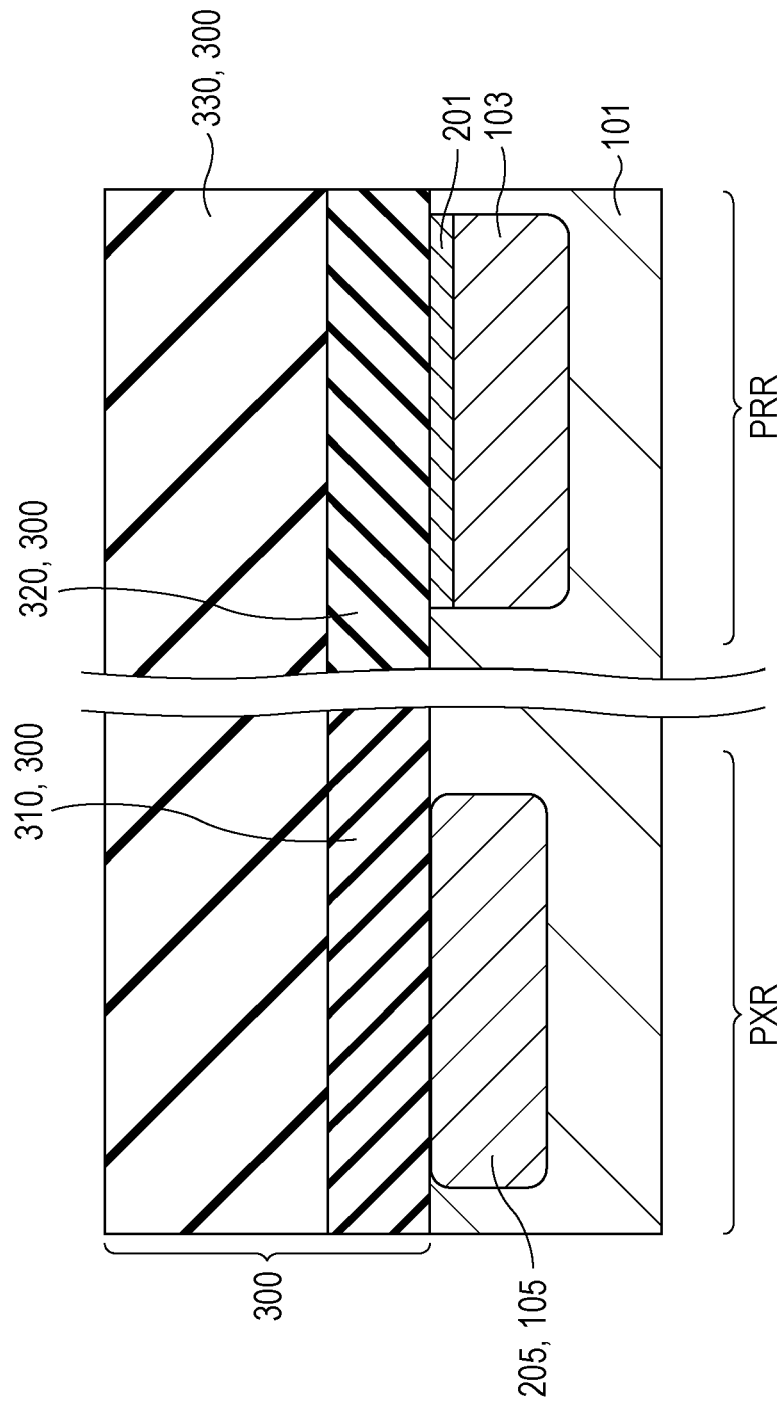

In the step A shown in FIGS. 3A-1 and 3A-2, element isolation regions 102 are formed in a silicon layer 101, and a semiconductor region 104 becoming the source of a transfer transistor is formed in the pixel area PXR. Furthermore, a gate insulating film 111 and a gate electrode 121 are formed on the silicon layer 101. A semiconductor region 105 becoming the drain of a transfer transistor is then formed. In the step A, an impurity region 205 (see FIG. 3A-2) in the semiconductor region 105 is self-aligned with respect to the gate electrode 121. In addition, in the step A, after the formation of the gate electrode 121, a P-type impurity region can be formed between the semiconductor region 104 and the surface of the silicon layer 101 in order to make the photoelectric conversion unit PD a buried type photodiode. In addition, a gate insulating film 110 and a gate electrode 120 of a peripheral transistor are formed in this order in the peripheral area PRR.

Subsequently, a first insulator layer 310 covering the pixel transistor (transfer transistor) is formed by a thermal CVD method or a plasma CVD method. Herein, the first insulator layer 310 may be used as an antireflection layer for the light-receiving surface of a silicon layer and may have a monolayer structure or a layered structure of a silicon oxide layer or a silicon nitride layer.

The first insulator layer 310 is remained in the pixel area PXR by selective anisotropic etching of an insulating film in the peripheral area PRR by etching technology in a state of covering the pixel area PXR with a resist mask. This etching forms a side wall spacer 122 of the peripheral transistor from the insulator for forming the first insulator layer 310. Using the side wall spacer 122, a semiconductor region 103 becoming the source-drain of the peripheral transistor is formed.

Subsequently, a cobalt layer as a refractory metal film and a titanium nitride layer as an antioxidant film for the refractory metal film are laminated on the semiconductor region 103 becoming the source-drain of the peripheral transistor and the gate electrode 120 by a CVD method or a PVD method. The semiconductor region 103 becoming the source-drain and the surface of the gate electrode 120 are reacted with the refractory metal film by heat treatment to form a silicide region 201. Herein, as the refractory metal film, for example, titanium, nickel, tungsten, molybdenum, tantalum, chromium, palladium, or platinum can be used instead of cobalt. As the antioxidant film, for example, nickel or titanium can be used instead of titanium nitride.

After the formation of the silicide region 201, a second insulator layer 320 covering the peripheral transistor is formed by a thermal CVD method or a plasma CVD method. Subsequently, a third insulator layer 330 constituted of, for example, silicon oxide or silicate glass containing boron and phosphorus is formed on the silicon layer 101. The third insulator layer 330 is planarized by, for example, a reflow method, an etch-back method, and a CMP method, alone or in combination.

As described above, a member (wafer) including a silicon layer 101, an insulator film 300, and silicide region 201 is prepared through a front end process.

Subsequently, in the step B shown in FIGS. 3B-1 and 3B-2, a hole 230 serving as a contact hole is formed in the pixel area PXR by photolithography technology and etching technology. In the formation of the hole 230, the first insulator layer 310 is used as an etching stopper in etching of the third insulator layer 330.

Figures 1, 3B:
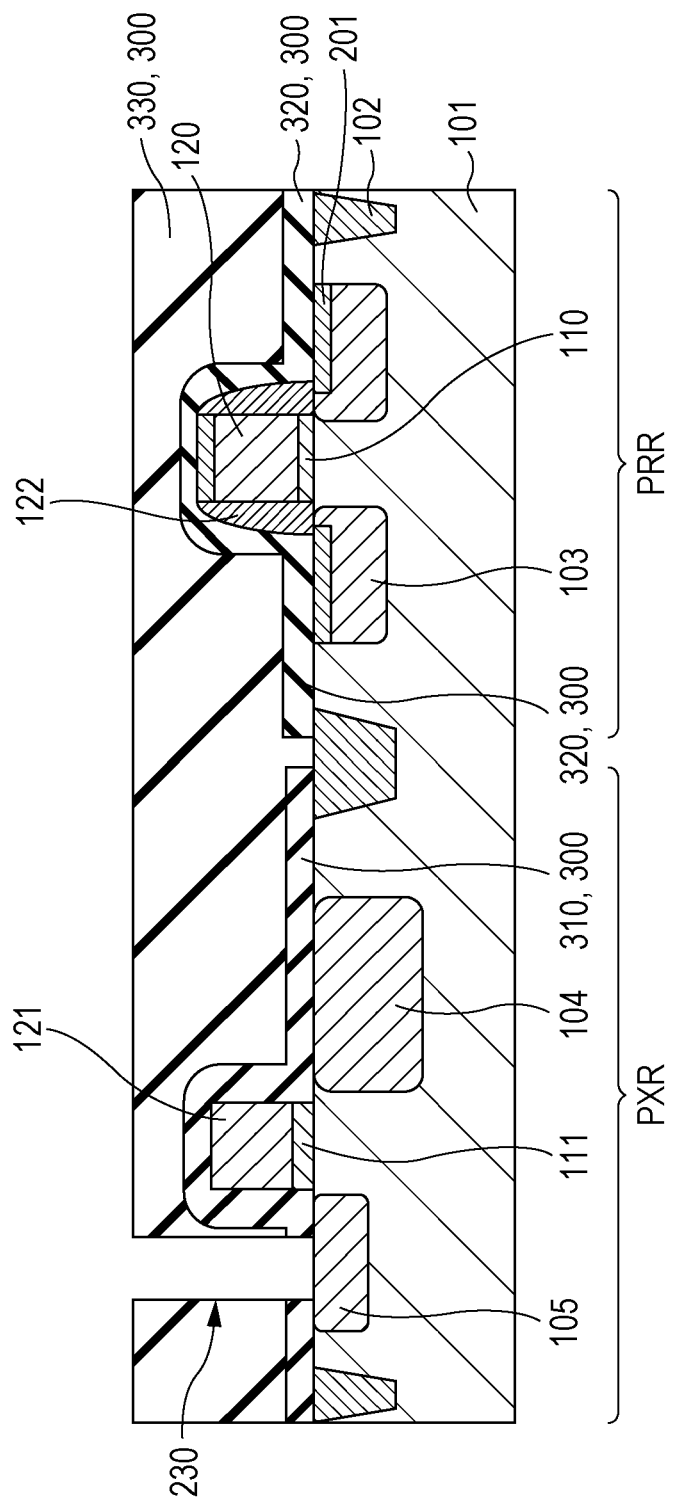

As shown in FIG. 3B-2, after the formation of the hole 230, an impurity is injected through the hole 230 into a portion of the impurity region 205 positioned under the hole 230. Consequently, a high-concentration impurity portion 211 having an impurity concentration higher than that of the impurity region 205 is formed in the semiconductor region 105 positioned under the insulator film 300. The high-concentration impurity portion 211 is self-aligned with respect to the hole 230. Consequently, the impurity concentration in the semiconductor region 105 under the contact plug 220 is increased, leading to a reduction in the contact resistance of the pixel circuit PXC.

Figures 1, 3C:
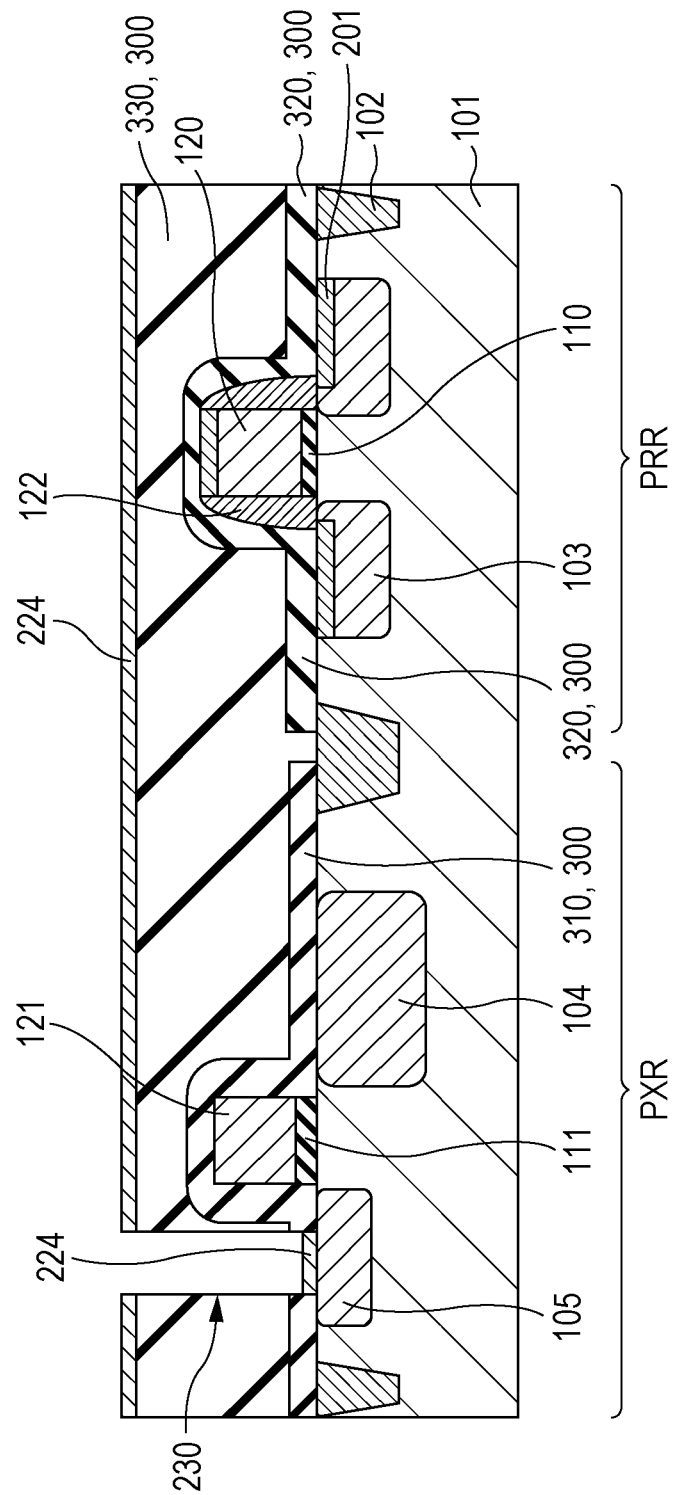
Figures 2, 3C:
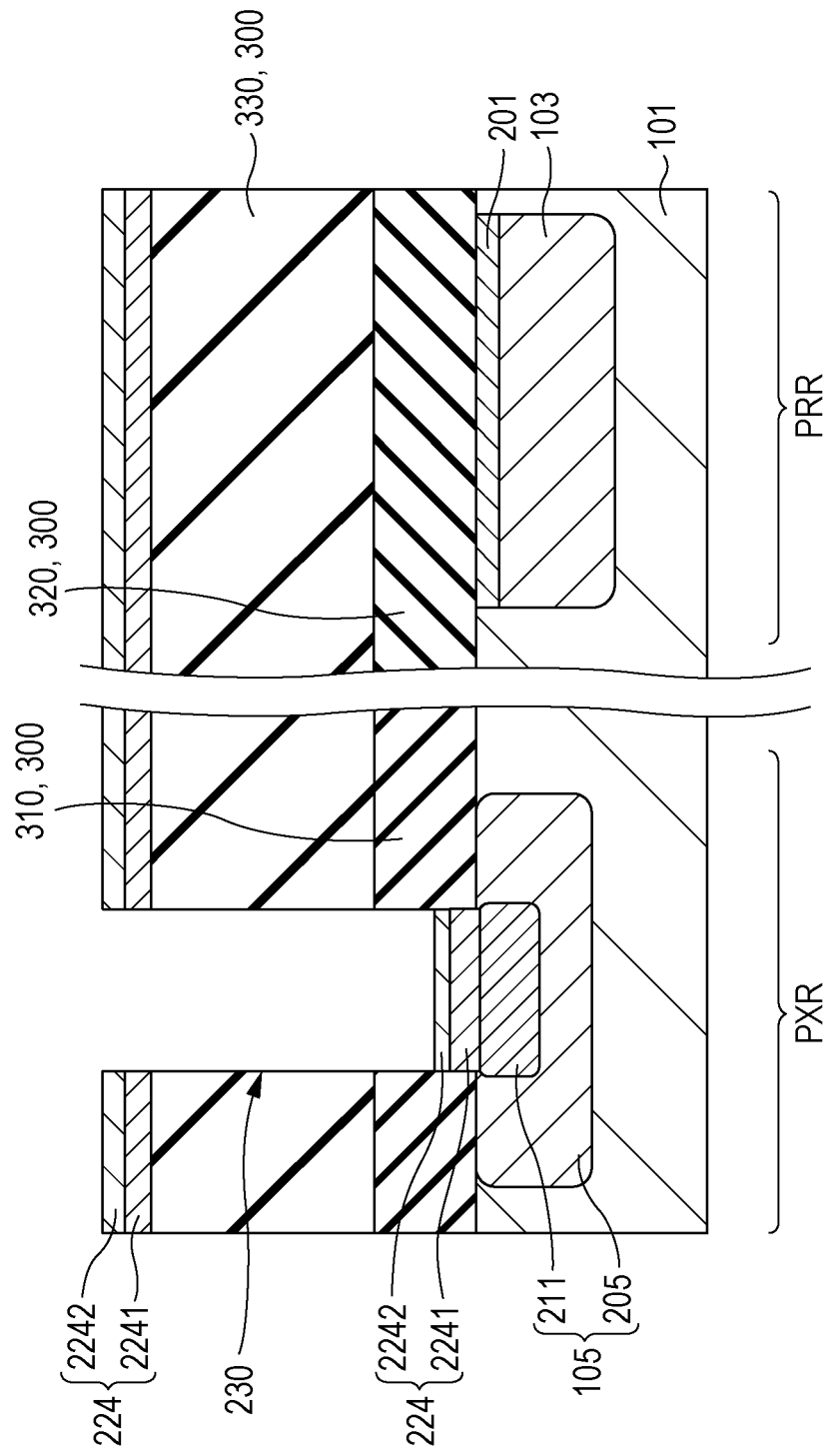

In the step C shown in FIGS. 3C-1 and 3C-2, a conductor film 224 containing a metal element Me2 as a barrier metal material is formed on the bottom of the hole 230 and the third insulator layer 330 by a PVD method, such as a sputtering method or a vapor deposition method. The formation of the conductor film 224 in the hole 230 by a PVD method is mainly purposed to form a conductor portion 222 on the bottom face of the hole 230. That is, since the deposition anisotropy of the PVD method is high compared to the CVD method, the conductor film 224 can be deposited on the bottom face to be thicker than on the side face of the hole 230. The thickness of the conductor film 224 on the bottom face of the hole 230 can be 10 to 100 nm, preferably 10 to 60 nm. The conductor film 224 can also be formed on the upper surface of the insulator film 300, in addition to the inside of the hole 230. If the conductor film 224 formed on the upper surface of the insulator film 300 has a thickness of about 10 to 100 nm, the conductor film 224 formed on the bottom face of the hole 230 can have a sufficient thickness. In the PVD method, the conductor film 224 can be hardly deposited on the side face of the hole 230, alternatively, a conductor film having a thickness smaller than that of the conductor film 224 on the bottom face of the hole 230 can also be formed. As shown in FIG. 3C-2, the conductor film 224 can be a layered film composed of a metal layer 2241 of a simple substance or an alloy of the metal element Me2 and a metal compound layer 2242 of a compound of the metal element Me2. However, the conductor film 224 may be a monolayer film of the metal layer 2241 or a monolayer film of the metal compound layer 2242. The metal layer 2241 of the conductor film 224 is in contact with the semiconductor region 105 (the high-concentration impurity portion 211). The metal compound layer 2242 is formed on the metal layer 2241. In this example, the metal layer 2241 is a titanium layer having a thickness of about 10 to 60 nm, and the metal compound layer 2242 is a titanium nitride layer having a thickness of about 10 to 40 nm.

Figures 1, 3D:
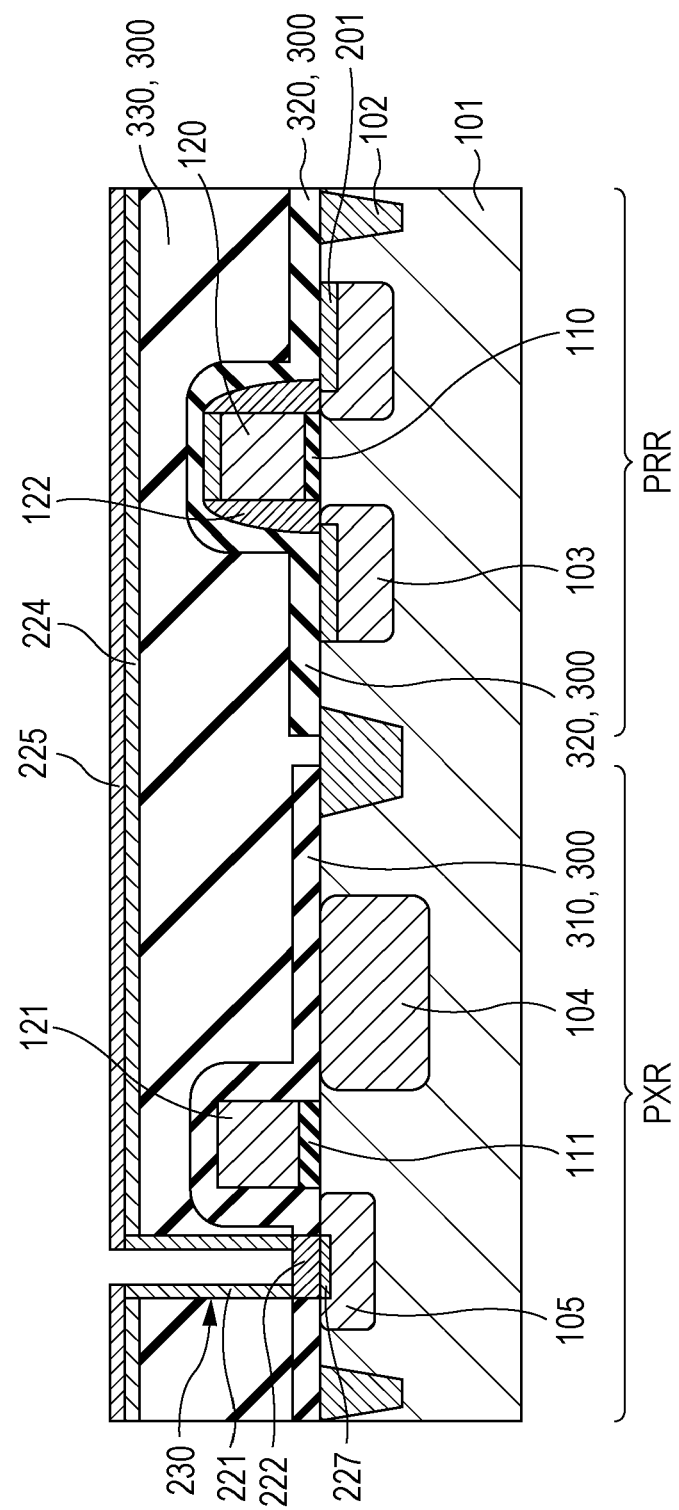

In the step D shown in FIGS. 3D-1 and 3D-2, a conductor film 225 containing the metal element Me2 as a barrier metal material is formed on the conductor film 224 in the hole 230 by a CVD method, such as a thermal CVD method, a plasma CVD method, and an MOCVD method. The formation of the conductor film 225 in the hole 230 by a CVD method is mainly purposed to form a conductor portion 221 on the side face of the hole 230. In the step C, the formation of the conductor film 224 having a large thickness by a CVD method can form a thick conductor film on the bottom face of the hole 230, but also forms a thick conductor film on the side face of the hole 230. If the conductor film formed on the side face of the hole 230 also has a large thickness, the resistance of the contact plug 220 increases. Accordingly, a film having an appropriate thickness which is not as thick as the conductor film 224 on the bottom face of the hole 230 can be formed on the side face of the hole 230 by a CVD method from a necessary barrier metal material. The conductive film 225 on the side face of the hole 230 can have a thickness of 1 to 100 nm, preferably 5 to 30 nm. It is also possible to form the conductor film 225 so as to include a titanium layer and form a titanium nitride layer by nitriding the titanium layer.

Heat treatment is performed at least one of during the step C, during the step D, between the step C and the step D, and after the step D. In this heat treatment, the silicon layer 101 (semiconductor region 105, high-concentration impurity portion 211) reacts (silicidation) with the metal element Me2 contained in the conductor film 224 to form a silicide region 227. Herein, the temperature of the heat treatment for silicidation is, for example, 400° C. to 700° C. and is desirably not higher than the heatproof temperature of the silicide region 201 of the peripheral area PRR. In this example, silicidation by heating of the wafer is performed simultaneously with the formation of the conductor film 225 by a CVD method.

The metal element Me2 of the silicide region 227 is mainly supplied from the layer (metal layer 2241) being in contact with the semiconductor region 105 of the conductor film 224. Accordingly, a part of the conductor film 224 (a part of the metal layer 2241) changes into the silicide region 227. Since the conductor film 224 on the hole 230 is formed so as to have a sufficiently large thickness, even if the silicide region 227 is formed, the residue of the metal layer 2241 remains as the metal layer 228. All or most of the metal compound layer 2242 remains. The portion 2251, on the bottom face of the hole 230, of the conductor film 225 formed in the step D and the metal compound layer 2242 formed in the step C constitute the metal compound layer 229 of the conductor portion 222. In this example, titanium (Ti) in the metal layer 2241, which is a titanium layer, reacts with silicon (Si) in the silicon layer 101 to form titanium silicide (TiSi). In the silicon layer 101, the silicon (Si) used for silicidation is supplied from the high-concentration impurity portion 211 positioned under the hole 230. On this occasion, impurities, such as phosphorus (P), contained in the high-concentration impurity portion 211 can also be contained in the silicide region 227. The impurity region 205 covered with the insulator film 300 is not silicided excluding the vicinity of the hole 230.

Figures 1, 3E:
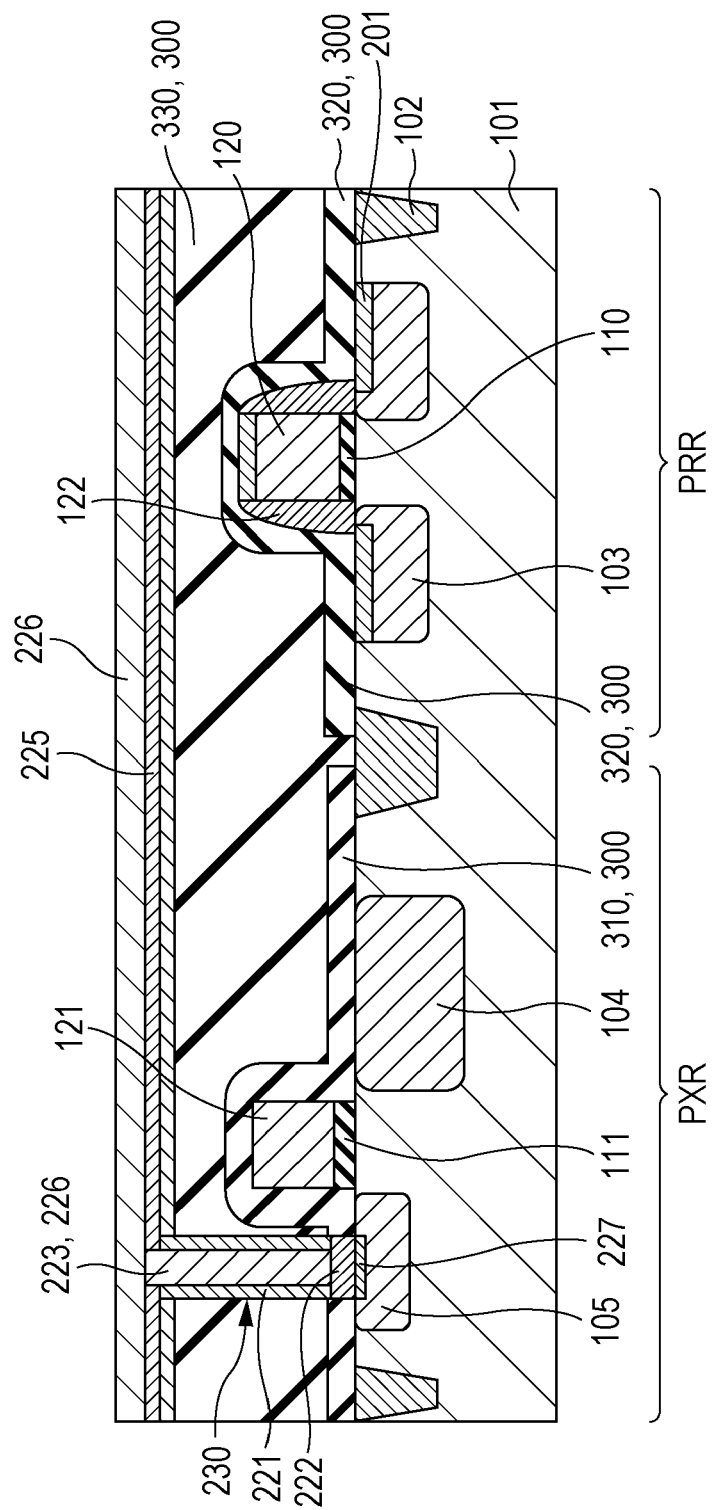
Figures 2, 3E:
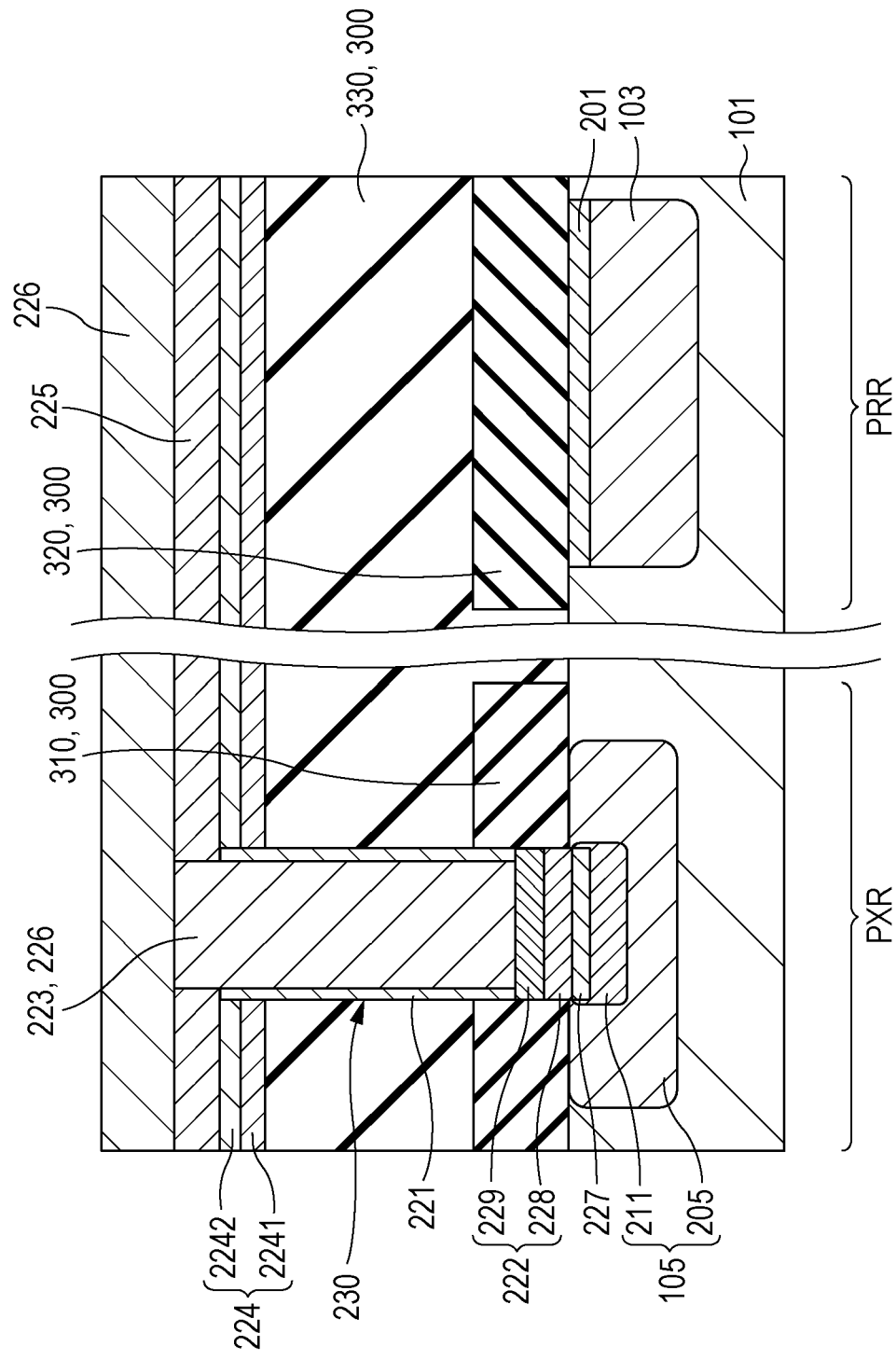

In the step E shown in FIGS. 3E-1 and 3E-2, a metal film 226 containing a metal element Me1, such as tungsten, is formed in the hole 230 and on the conductor film 225. In the metal film 226, the position positioned in the hole 230 is the metal portion 223.

In the step F shown in FIGS. 3F-1 and 3F-2, the unnecessary metal film 226 on the upper surface of the insulator film 300 is removed by, for example, a CMP method to form a contact plug 220 including the metal portion 223.

Figures 1, 4F:
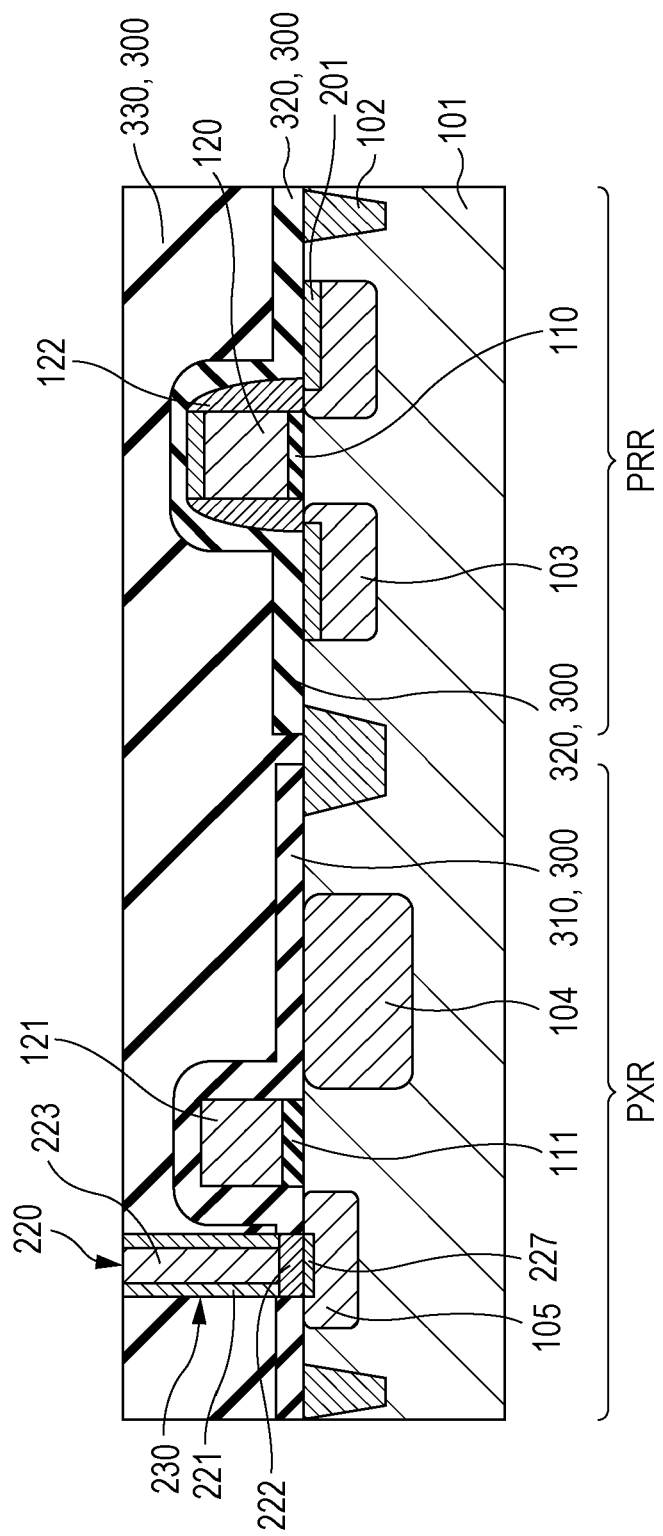
Figures 2, 4F:
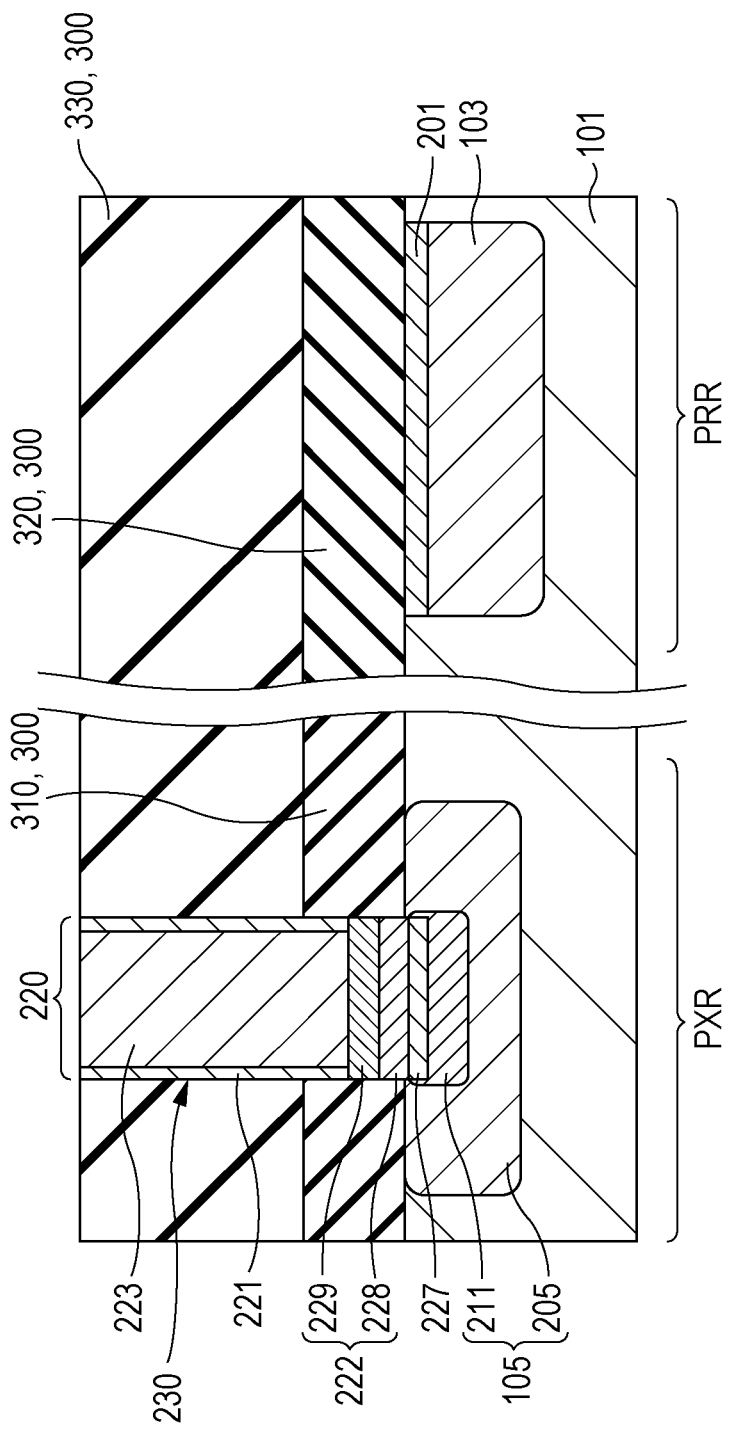
Figures 1, 4G:
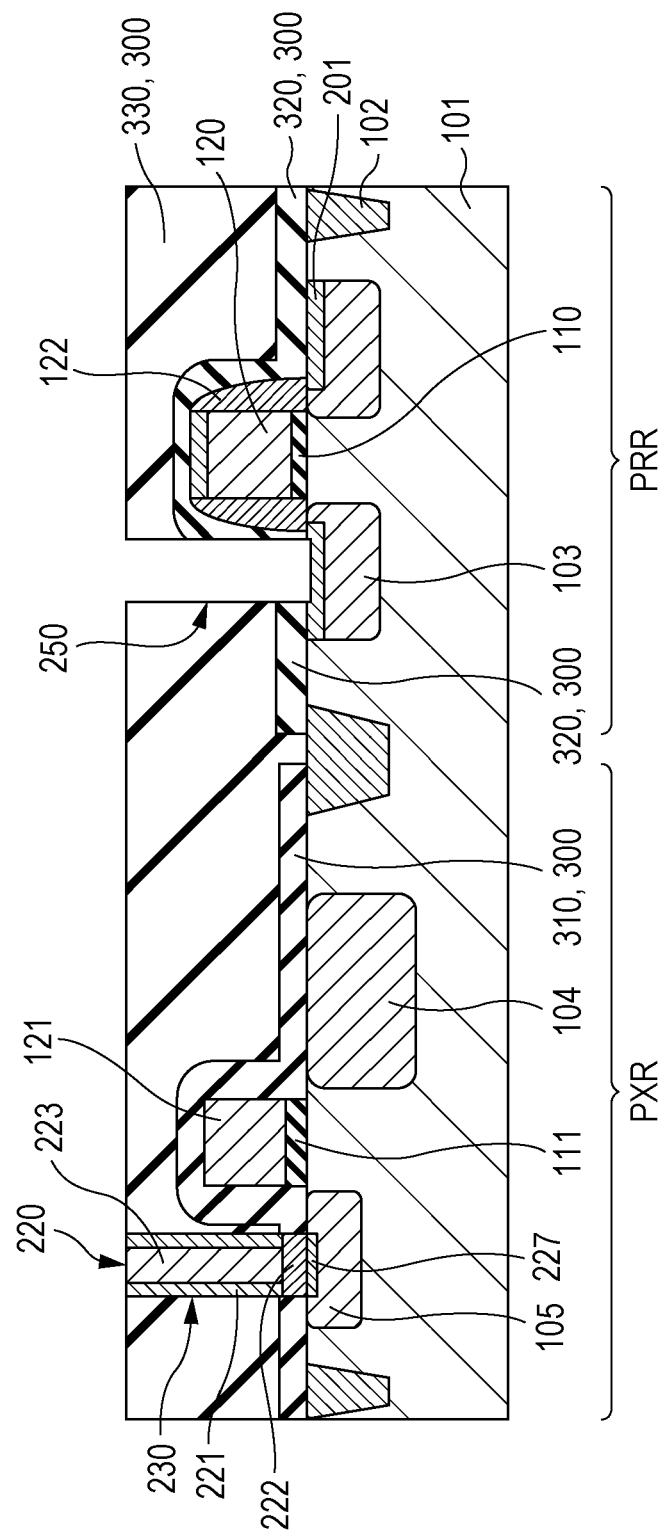
Figures 2, 4G:
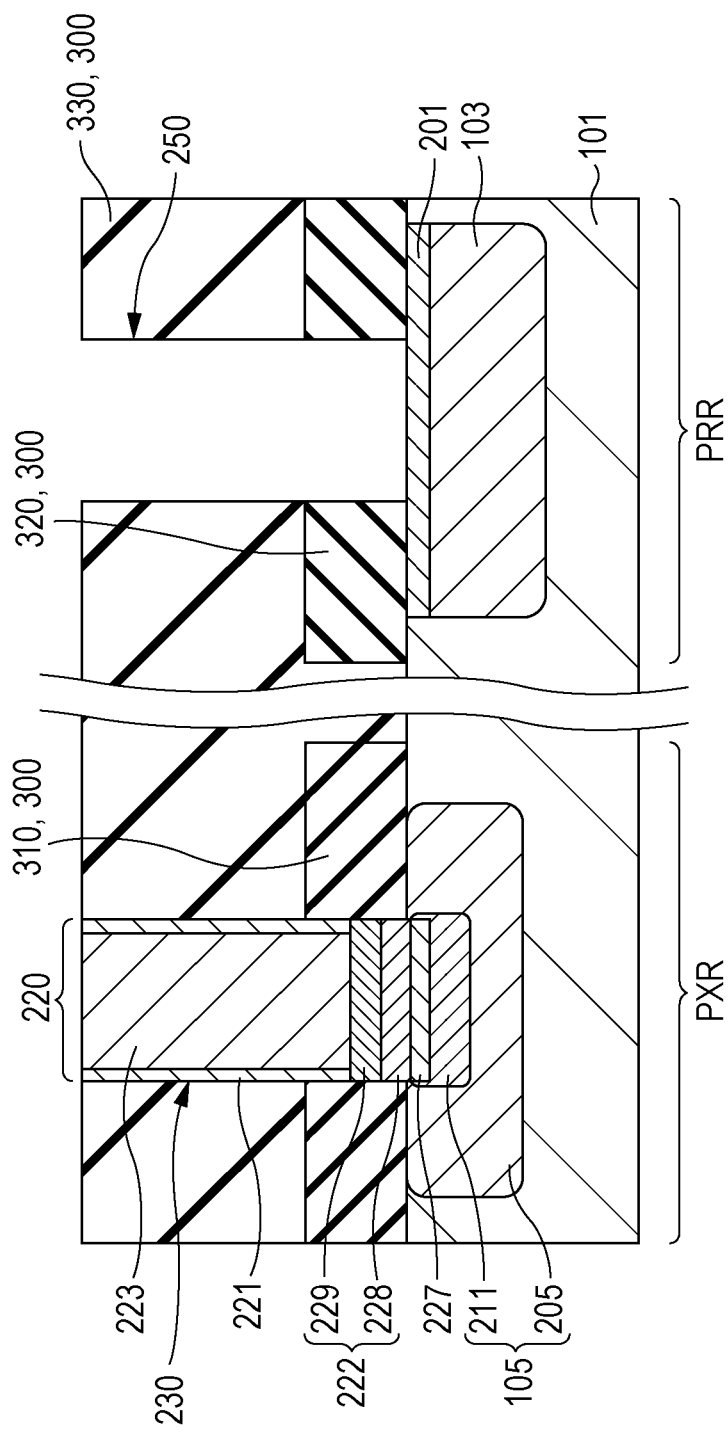

In the step G shown in FIGS. 4G-1 to 4G-2, a hole 250 serving as a contact hole is formed in the peripheral area PRR by photolithography technology and etching technology. In the formation of the hole 250, the second insulator layer 320 is used as an etching stopper in etching of the third insulator layer 330.

Figures 1, 4H:
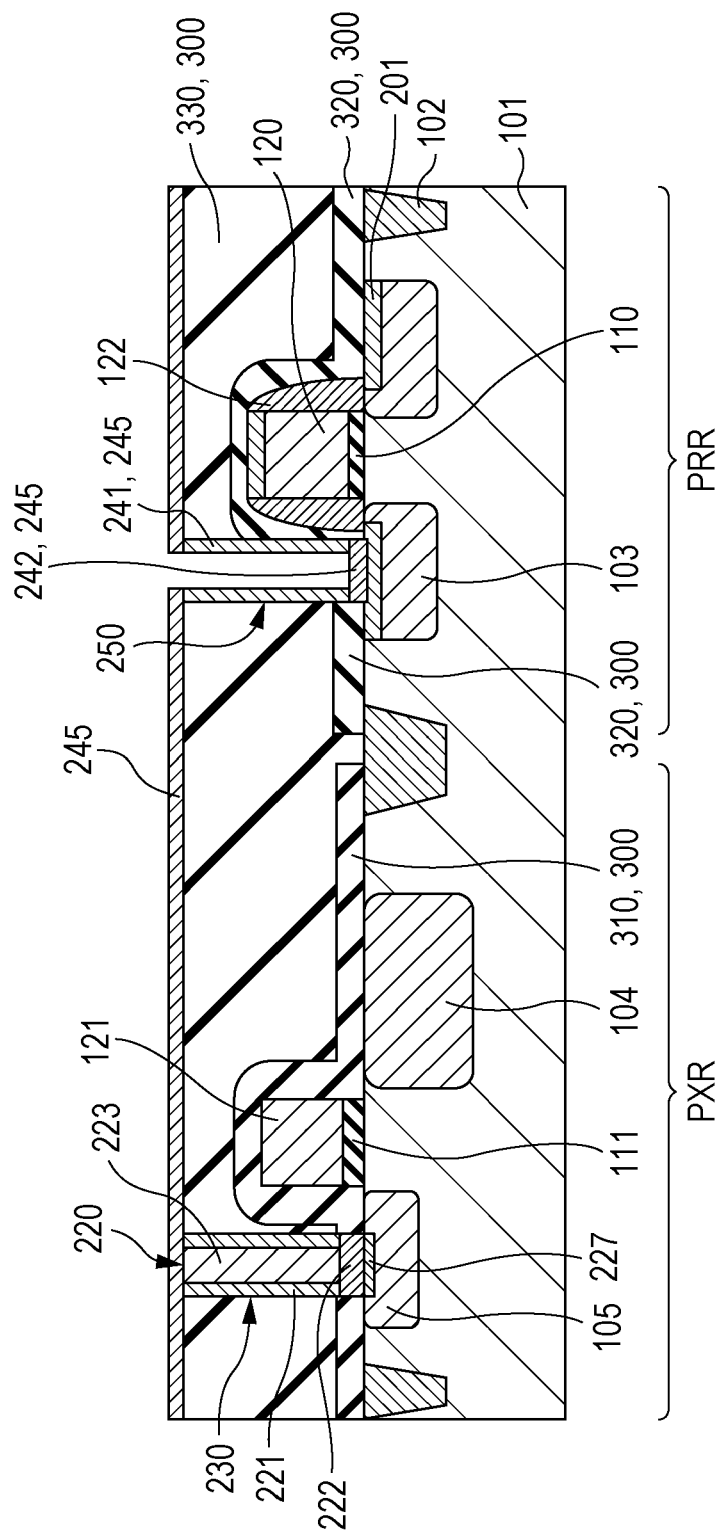
Figures 2, 4H:
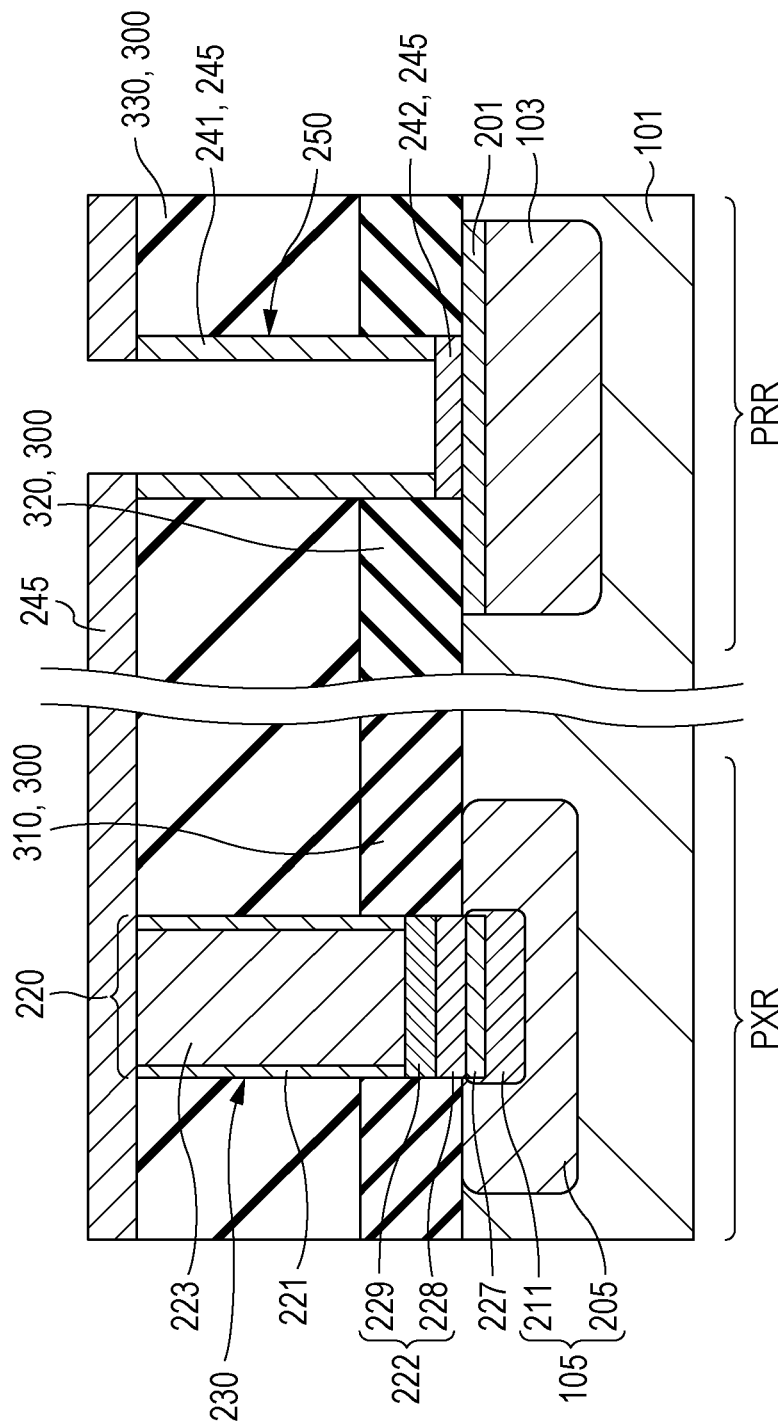

In the step H shown in FIGS. 4H-1 and 4H-2, a conductor film 245 of a monolayer film or a layered film of a titanium layer and a titanium nitride layer is formed in the hole 250 of the peripheral area PRR and on the third insulator layer 330 by a CVD method or a PVD method. For example, a conductor film 245 including a titanium layer and a titanium nitride layer is formed as conductor portion 242 and 245 on the bottom face of the hole 250 and on the third insulator layer 330, respectively, by a CVD method. Herein, the conductor portion 242 formed on the bottom face of the hole 250 is in contact with the silicide region 201. Herein, the thickness of the conductor portion 241 of the conductor film 245 formed on the side face of the hole 250 can be equal to the thickness of the conductor portion 242 of the conductor film 245 formed in the conductor portion of the hole 250. It is also possible to nitride unreacted titanium in the conductor portions 242, 241, and 245 into titanium nitride. It is also possible to form a titanium film in the conductor portion of the hole 250 by a PVD method and then form a titanium nitride film on the conductor portion of the hole 250 and side face of the hole 250 by a CVD method or an MOCVD method. Herein, the thickness, corresponding to the thickness TBB, of the conductor film 245 on the bottom face of the hole 250 is, for example, 5 to 20 nm. The thickness, corresponding to the thickness TSB, of the conductor film 245 on the side face of the hole 250 is also, for example, 5 to 20 nm.

Figures 1, 4I:
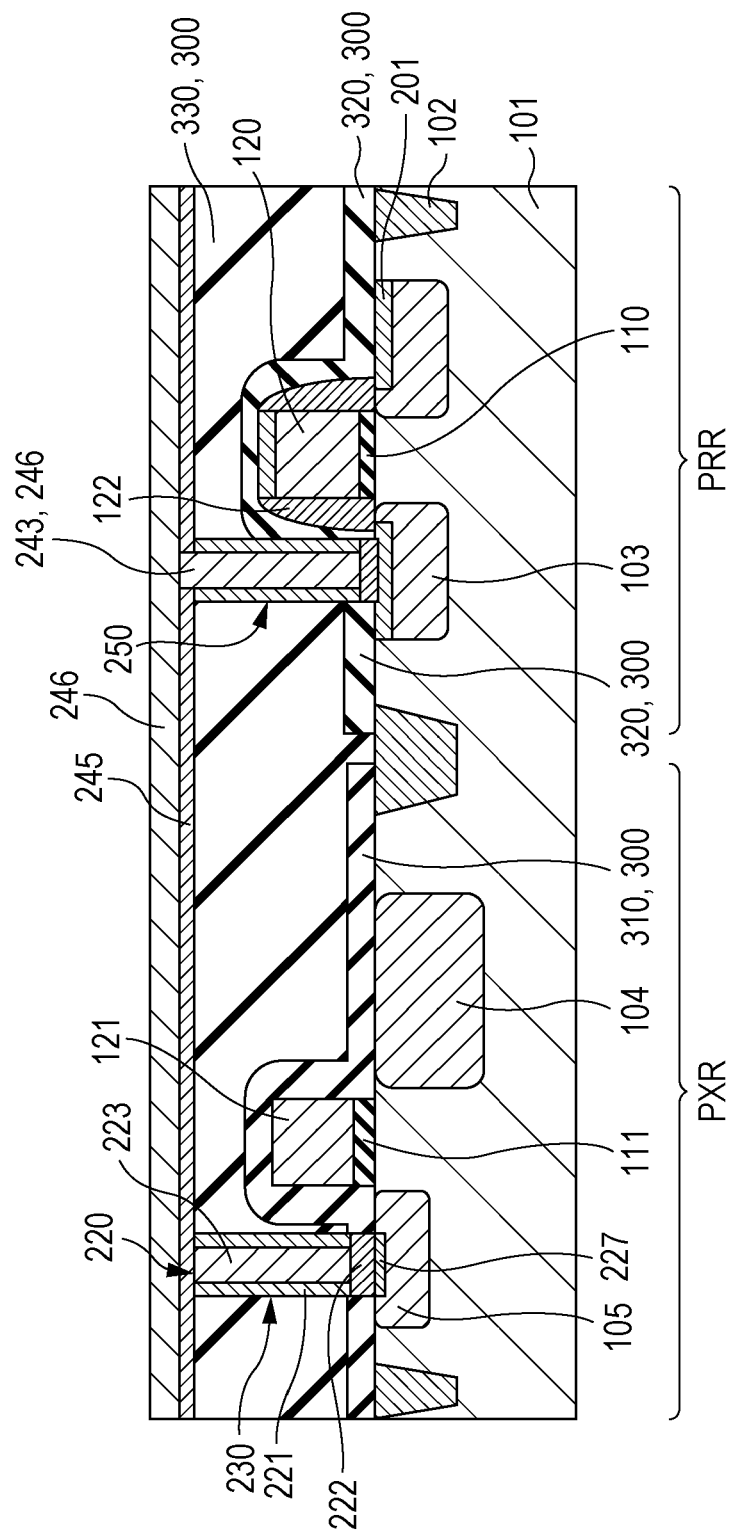
Figures 2, 4I:
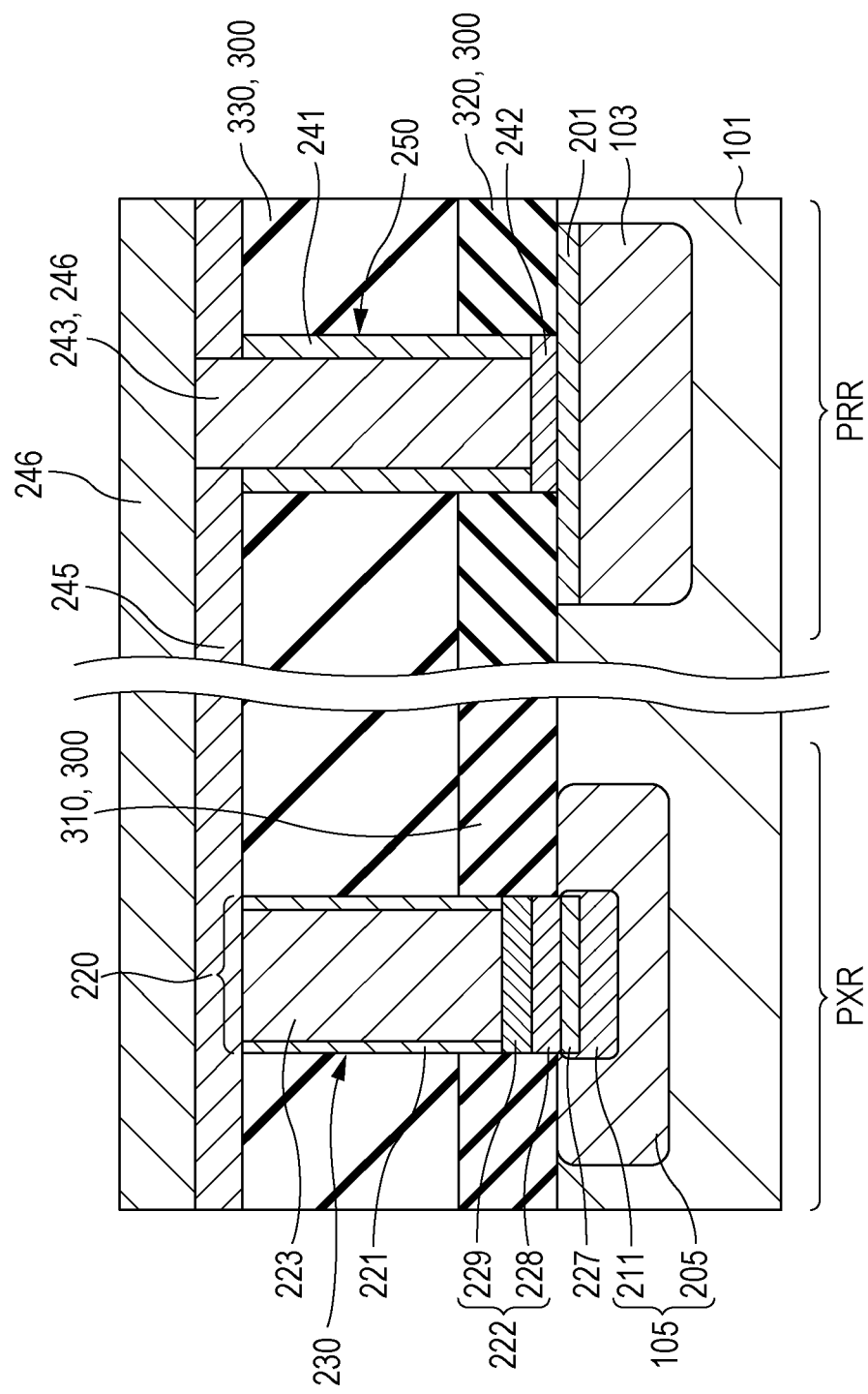

Subsequently, in the step I shown in FIGS. 4I-1 and 4I-2, a metal film 246 containing a metal element Me1, such as tungsten, is formed in the hole 250 of the peripheral area PRR and on the conductor film 245. In the metal film 246, the portion positioned in the hole 250 is the metal portion 243.

Figures 1, 4J:
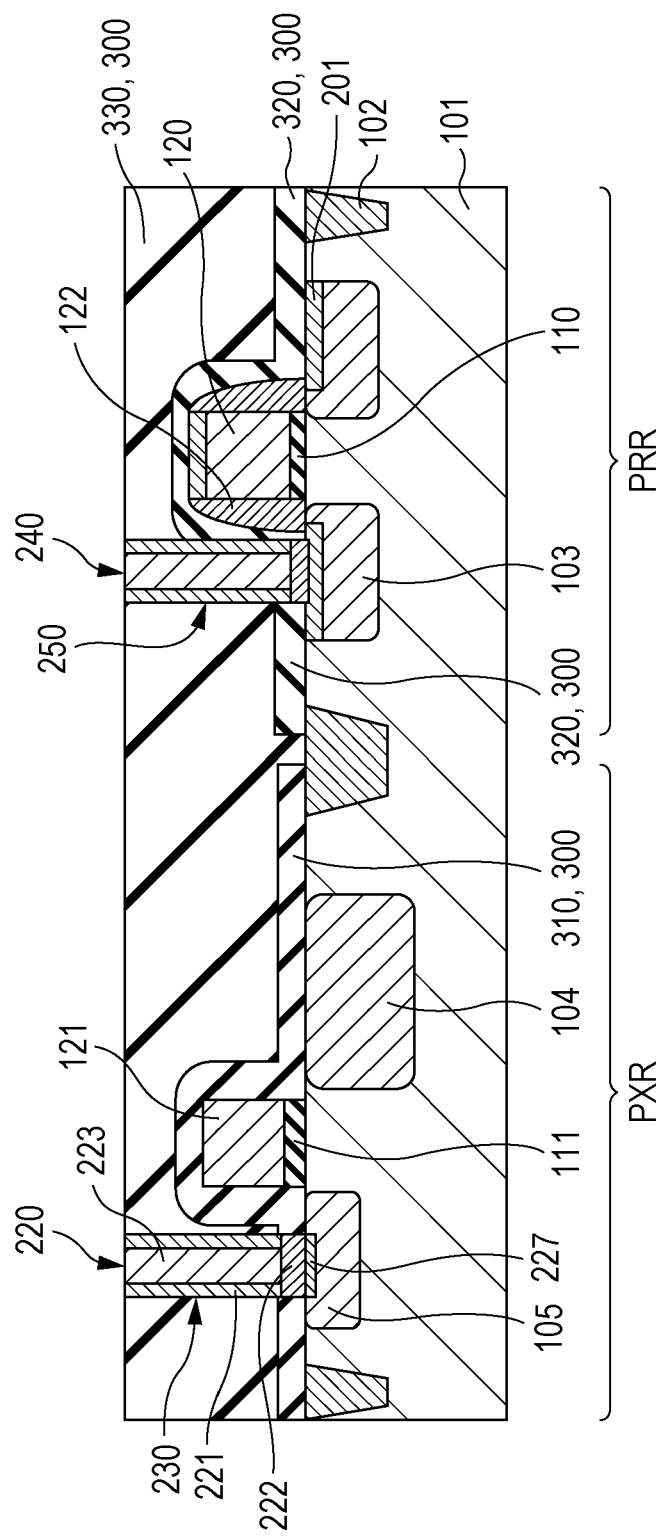
Figures 2, 4J:
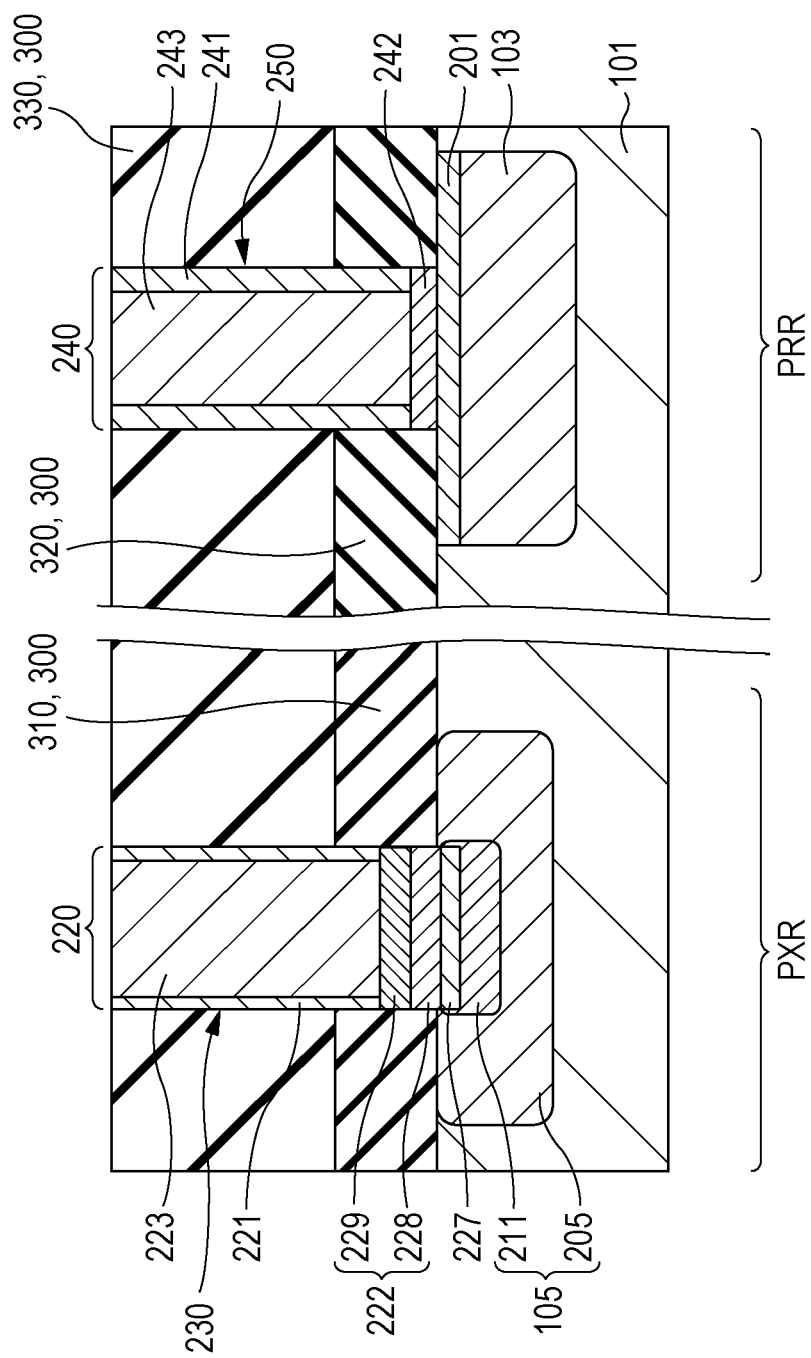

Subsequently, in the step J shown in FIGS. 4J-1 and 4J-2, the unnecessary metal film 246 on the upper surface of the insulator film 300 is removed by, for example, a CMP method to form a contact plug 240 including a metal portion 243. Herein, since the conductor portion 242 of the contact plug 240 is in contact with the silicide region 201, the contact resistance of the contact plug 240 is low, and the thickness TBB of the conductor portion 242 of the contact plug 240 need not be increased compared to that in the pixel area PXR. Accordingly, the thicknesses of the conductor portions 241 and 242 can be reduced. Herein, the metal portion 243 of, for example, tungsten can have a resistivity lower than those of the conductor portions 241 and 242 of titanium or titanium nitride. If the contact resistance between the silicide region 201 and the contact plug 240 is not a matter, the contact resistance decreases with the thickness TBB of the conductor portion 242.

Subsequently, steps, such as a step of forming a wiring layer 210, a step of forming an optical element, such as a color filter and a microlens, a step of dicing a wafer into a chip, and a step of packaging the chip are performed to accomplish a semiconductor apparatus AP.

Thus, the relationship, TBB<TBA, described above can be suitably satisfied by forming the conductor films 224 and 225 in the hole 230. The sum of the thicknesses of the conductor film 224 and the conductor film 225 on the bottom face of the hole 230 can be larger than the thickness of the conductor film 245 on the bottom face of the hole 250. This can be readily achieved by forming the conductor film 224 by a PVD method. If the sum of the thicknesses of the conductor film 224 and the conductor film 225 on the bottom face of the hole 230 is smaller than the thickness of the conductor film 245, the risk of not satisfying the relationship TBB<TBA increases. This can be described as follows. The metal element Me2 in the conductor film 224 and the conductor film 225 is incorporated into the silicide region 227, and the thickness TBA of the conductor portion 222 is reduced depending on the incorporation amount of the metal element Me2. In contrast, since the metal element Me2 of the conductor film 245 is hardly incorporated into the already existing silicide region 201, the thickness TBB of the conductor portion 242 does not vary from the thickness of the conductor film 245. Accordingly, even if the conductor films having the same thickness are merely formed in the hole 230 and the hole 250, the possibility of satisfying the relationship TBB>TBA is high.

A modification of the method of producing a semiconductor apparatus will be described. In this embodiment, a conductor film 224 forming a conductor portion 222 is formed by one of a PVD method and a CVD method, and a conductor film 225 is formed by the other of the PVD method and the CVD method. The order of the step C and the step D may be reversed, i.e., a conductor film 225 being in contact with the semiconductor region 105 is formed by a CVD method, and a conductor film 224 may be then formed by a PVD method. However, a conductor film 224 formed by a PVD method hardly causes abnormal growth of a silicide region 227, compared to a conductor film 225 formed by a CVD method. Accordingly, it is advantageous to form the conductor film 224 by a PVD method prior to formation of the conductor film 225 by a CVD method. A reduction in the abnormal growth of the silicide region 227 can prevent leakage current and a variation in contact resistance caused by the contact plug 220.

The order of formation of a metal layer 2241 and a metal compound layer 2242 in the step C may be reversed, i.e., a metal compound layer 2242 being in contact with the semiconductor region 105 is formed, and a metal layer 2241 may be then formed. However, the metal layer 2241 appropriately grows a silicide region 227, compared to the metal compound layer 2242. Accordingly, it is advantageous to form the metal layer 2241 prior to formation of the metal compound layer 2242.

The contact plug 220 is formed (steps "b" to "f"), and then the contact plug 240 is formed (steps "g" to "j"), but the contact plug 220 may be formed after the formation of the contact plug 240. However, it is advantageous to perform heat treatment for forming a silicide region 227 before the formation of the contact plug 240 from the viewpoint of preventing diffusion of the metal elements Me1, Me2, and Me3 through a thin conductor portion 242. Accordingly, it is advantageous to form the contact plug 240 (steps "g" to "j") after the formation of the contact plug 220 (steps "b" to "f").

Alternatively, a part of the contact plug 220 and a part of the contact plug 240 may be simultaneously formed. Both the hole 230 and the hole 250 are formed before the formation of the metal portion 223 of the contact plug 220 and the metal portion 243 of the contact plug 240. For example, a conductor portion 222 and a conductor portion 242 are separately formed, and a metal portion 223 and a metal portion 243 may be then simultaneously formed. Alternatively, the conductor film 225 and the conductor film 245 may be simultaneously formed in a step different from the formation of the conductor film 224. In such a case, in order to prevent an unnecessary conductive material from remaining in the hole 230, 250, it is necessary to block one of the hole 230 and the hole 250 with a mask or to remove an unnecessary conductive material in the hole 230, 250. As described above, in the method of producing a semiconductor apparatus, it is advantageous to form the hole 250 after the formation of the contact plug 220 or to form the hole 230 after the formation of the contact plug 240. Such a method can easily prevent the hole 230, 250 from including an unnecessary material.

The structure, excluding the pixel unit UNT, of the semiconductor apparatus AP will be described using FIG. 1A. The peripheral circuit PRC can include a vertical driving circuit VDC driving a plurality of pixel units UNT, a signal processing circuit SPC processing the signals from a plurality of pixel circuits, and a horizontal scanning circuit HSC sequentially outputting the signals processed by the signal processing circuit SPC. The peripheral circuit PRC can include an output circuit OPC outputting the signals generated in the signal processing circuit SPC. The peripheral circuit PRC can include a control circuit CC controlling the vertical driving circuit VDC, the signal processing circuit SPC, and the horizontal scanning circuit HSC.

The signal processing circuit SPC can include a correlated double sampling (CDS) circuit, an amplification circuit, and an analog-to-digital (AD) converter circuit. The control circuit CC can include a timing generator. The vertical driving circuit VDC and the horizontal scanning circuit HSC can each include a shift register and an address recorder. The output circuit OPC can include an LVDS driver.

The peripheral circuit PRC in a semiconductor chip IC can be arranged in the peripheral area PRR positioned in the periphery of the pixel unit UNT. The peripheral transistor provided with the above-described silicide region 201 and contact plug 240 can be applied to the transistor of every circuit in the peripheral circuit PRC. However, at least a part of the vertical driving circuit VDC, the signal processing circuit SPC, the horizontal scanning circuit HSC, the control circuit CC, and the output circuit OPC may be provided in a semiconductor chip different from the semiconductor chip including a plurality of pixel circuits. This another semiconductor chip and the semiconductor chip including a plurality of pixel circuits may be stacked.

The image pickup system SYS shown in FIG. 1B can be electronic equipment, such as a camera and an information terminal having a photographing function. Alternatively, the image pickup system SYS can be transporting equipment, such as a vehicle, a ship, and a flight vehicle. The image pickup system SYS as transporting equipment is suitable for transporting a semiconductor apparatus AP or for assisting and/or automating the driving (operation) by the photographing function.

The semiconductor apparatus AP can further include, in addition to the semiconductor chip IC, a package PKG accommodating the semiconductor chip IC. The package PKG can include a substrate to which the semiconductor chip IC is fixed, a lid, such as glass, facing the semiconductor chip IC, and a connection member, such as a bonding wire and a bump, connecting the terminal provided to the substrate and the terminal provided to the semiconductor chip IC.

The optical unit OU forms an image on the semiconductor apparatus AP and is, for example, a lens, a shutter, or mirror. The control unit CU controls the semiconductor apparatus AP and is, for example, a semiconductor apparatus, such as an ASIC. The processing unit PU processes the signals output from the semiconductor apparatus AP and is a semiconductor apparatus, such as a CPU or an ASIC, for constituting an analog front end (AFE) or a digital front end (DFE). The display unit DU is an EL display unit or a liquid crystal display unit displaying an image obtained in the semiconductor apparatus AP. The memory unit MU is a semiconductor device or a magnetic device storing the image obtained in the semiconductor apparatus AP and is a volatile memory, such as an SRAM and a DRAM or a nonvolatile memory, such as a flash memory and a hard disk drive.

The embodiments relating to the semiconductor apparatus AP described above can be appropriately modified within a range not departing from the scope of the present invention. The semiconductor apparatus AP to which the present disclosure is applied is not limited to a photoelectric conversion apparatus and may be any semiconductor apparatus that is appropriate to include a plurality of contact plugs having different electrical properties, such as a semiconductor apparatus loading both an analog circuit and a digital circuit.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-254369 filed Dec. 27, 2016, which is hereby incorporated by reference herein in its entirety.

What is claimed is:
1. A semiconductor apparatus comprising:
a silicon layer including a first semiconductor region and a second semiconductor region;
an insulator film disposed on the silicon layer and having a first hole positioned on the first semiconductor region and a second hole positioned on the second semiconductor region;
a first metal portion disposed in the first hole and containing a first metal element;
a first conductor portion disposed between the first metal portion and the first semiconductor region and containing a second metal element different from the first metal element;
a first silicide region disposed between the first conductor portion and the first semiconductor region and containing the second metal element;
a second metal portion disposed in the second hole and containing the first metal element;
a second conductor portion disposed between the second metal portion and the second semiconductor region and containing the second metal element; and
a second silicide region disposed between the second conductor portion and the second semiconductor region and containing a third metal element different from the first metal element and different from the second metal element, wherein
a thickness of the first conductor portion is larger than a thickness of the first silicide region and larger than a thickness of the second conductor portion.

2. The semiconductor apparatus according to claim 1, wherein
a resistivity of the first conductor portion is higher than a resistivity of the first metal portion; and
a resistivity of the second conductor portion is higher than a resistivity of the second metal portion.

3. The semiconductor apparatus according to claim 1, further comprising:
a third conductor portion disposed between the first metal portion and the insulator film and containing a metal element different from the metal element contained in the first metal portion; and
a fourth conductor portion disposed between the second metal portion and the insulator film and containing a metal element different from the metal element contained in the second metal portion, wherein
a thickness ratio of the first conductor portion to the third conductor portion is larger than a thickness ratio of the second conductor portion to the fourth conductor portion.

4. The semiconductor apparatus according to claim 1, further comprising:
a third conductor portion disposed between the first metal portion and the insulator film and containing a metal element different from the metal element contained in the first metal portion; and
a fourth conductor portion disposed between the second metal portion and the insulator film and containing a metal element different from the metal element contained in the second metal portion, wherein
a thickness of the third conductor portion is smaller than a thickness of the fourth conductor portion.

5. The semiconductor apparatus according to claim 1, wherein
the first conductor portion includes a first metal layer containing the second metal element and a first metal compound layer disposed between the first metal layer and the first metal portion, wherein the first metal layer has a thickness is larger than the thickness of the first metal compound layer and/or the thickness of the second conductor portion.

6. The semiconductor apparatus according to claim 1, wherein the first metal element is tungsten;

the second metal element is titanium; and the third metal element is cobalt or nickel.

7. The semiconductor apparatus according to claim 1, wherein a width of the first hole is different from a width of the second hole.

8. The semiconductor apparatus according to claim 1, wherein the first semiconductor region and the second semiconductor region each constitute a drain of a transistor.

9. The semiconductor apparatus according to claim 1, wherein the first semiconductor region includes an impurity region positioned under the insulator film, and includes a portion positioned under the first hole and having an impurity concentration higher than that of the impurity region.

10. The semiconductor apparatus according to claim 1, wherein the first semiconductor region constitutes a pixel circuit; and the second semiconductor region constitutes a peripheral circuit.

11. The semiconductor apparatus according to claim 1, wherein a charge generated in a photoelectric conversion unit is transferred to the first semiconductor region.

12. A system comprising:

the semiconductor apparatus according to claim 1; and at least one of an optical unit forming an image on the semiconductor apparatus, a control unit controlling the semiconductor apparatus, a processing unit processing a signal output from the semiconductor apparatus, a display unit displaying information obtained in the semiconductor apparatus, and a memory unit storing the information obtained in the semiconductor apparatus.

13. A semiconductor apparatus comprising:

a silicon layer including a first semiconductor region and a second semiconductor region;

an insulator film disposed on the silicon layer and having a first hole positioned on the first semiconductor region and a second hole positioned on the second semiconductor region;

a first contact plug disposed in the first hole;

a second contact plug disposed in the second hole;

a first silicide region disposed between the first contact plug and the first semiconductor region; and a second silicide region disposed between the second contact plug and the second semiconductor region and between the insulator film and the second semiconductor region, wherein the first contact plug includes a first metal portion and a first barrier metal portion;

the second contact plug includes a second metal portion and a second barrier metal portion; and the first barrier metal portion includes a first portion positioned between the first metal portion and the first silicide region, the first barrier metal portion includes a second portion positioned between the second metal portion and the second silicide region, and a thickness of the first portion is larger than a thickness of the first silicide region and larger than a thickness of the second portion.

14. The semiconductor apparatus according to claim 13, wherein the first barrier metal portion includes a third portion positioned between the first metal portion and the insulator film, the second barrier metal portion includes a fourth portion positioned between the second metal portion and the insulator film, and a thickness of the third portion is smaller than a thickness of the fourth portion.

15. The semiconductor apparatus according to claim 13, wherein a thickness ratio of the first portion to a third portion positioned between the first metal portion and the insulator film in the first barrier metal portion is larger than a thickness ratio of the second portion to a fourth portion positioned between the second metal portion and the insulator film in the second barrier metal portion.

16. The semiconductor apparatus according to claim 13, wherein a width of the first hole is different from a width of the second hole.

17. A system comprising:

the semiconductor apparatus according to claim 13; and at least one of an optical unit forming an image on the semiconductor apparatus, a control unit controlling the semiconductor apparatus, a processing unit processing a signal output from the semiconductor apparatus, a display unit displaying information obtained in the semiconductor apparatus, and a memory unit storing the information obtained in the semiconductor apparatus.

* * * * *